United States Patent
Del Tin et al.

(10) Patent No.: US 12,243,714 B2
(45) Date of Patent: Mar. 4, 2025

(54) LENS DESIGNS

(71) Applicant: ASML Netherlands B.V., Veldhoven (NL)

(72) Inventors: Laura Del Tin, The Hague (NL); Almut Johanna Stegemann, Wateringen (NL); German Aksenov, Delft (NL); Diego Martinez Negrete Gasque, Delft (NL); Pieter Lucas Brandt, Son (NL)

(73) Assignee: ASML Netherlands B.V., Veldhoven (NL)

( * ) Notice: Subject to any disclaimer, the term of this patent is extended or adjusted under 35 U.S.C. 154(b) by 227 days.

(21) Appl. No.: 17/897,080

(22) Filed: Aug. 26, 2022

(65) Prior Publication Data

US 2022/0406563 A1 Dec. 22, 2022

Related U.S. Application Data

(63) Continuation of application No. PCT/EP2021/054008, filed on Feb. 18, 2021.

(51) Int. Cl.
*H01J 37/317* (2006.01)
*H01J 37/09* (2006.01)
(Continued)

(52) U.S. Cl.
CPC .......... *H01J 37/3177* (2013.01); *H01J 37/09* (2013.01); *H01J 37/12* (2013.01); *H01J 37/20* (2013.01);
(Continued)

(58) Field of Classification Search
CPC .. H01J 37/09; H01J 37/20; H01J 37/12; H01J 37/28; H01J 37/143; H01J 37/145;
(Continued)

(56) References Cited

U.S. PATENT DOCUMENTS 3,930,163 A * 12/1975 Gerlach .................. H01J 27/20
250/398
6,617,595 B1 9/2003 Okunuki
(Continued)

FOREIGN PATENT DOCUMENTS

DE 3734620 C1 12/1988
JP S63136449 A 6/1988
(Continued)

OTHER PUBLICATIONS

International Search Report received from the International Search Authority issued in related International Application No. PCT/EP2021/054008 mailed Jul. 13, 2021 (5 pgs.).
(Continued)

*Primary Examiner* — David E Smith
*Assistant Examiner* — Hsien C Tsai
(74) *Attorney, Agent, or Firm* — Finnegan, Henderson, Farabow, Garrett & Dunner, LLP

(57) ABSTRACT

Disclosed herein is an multi-array lens configured in use to focus a plurality of beamlets of charged particles along a multi-beam path, wherein each lens in the array comprises: an entrance electrode; a focusing electrode and a support. The focusing electrode is down beam of the entrance electrode along a beamlet path and is configured to be at a potential different from the entrance electrode. The support is configured to support the focusing electrode relative to the entrance electrode. The focusing electrode and support are configured so that in operation the lens generates a rotationally symmetrical field around the beamlet path.

20 Claims, 7 Drawing Sheets

(51) Int. Cl.
*H01J 37/12* (2006.01)
*H01J 37/20* (2006.01)
*H01J 37/28* (2006.01)

(52) U.S. Cl.
CPC ....... *H01J 37/28* (2013.01); *H01J 2237/1205* (2013.01); *H01J 2237/2817* (2013.01)

(58) Field of Classification Search
CPC .............. H01J 37/285; H01J 37/3177; H01J 2237/1205; H01J 2237/1215; H01J 2237/1415; H01J 2237/2817; H01J 2237/04756; H01J 2237/24592
See application file for complete search history.

(56) References Cited

U.S. PATENT DOCUMENTS

| | | |
|---|---|---|
| 10,312,052 B2 | 6/2019 | Kruit |
| 2002/0130262 A1 | 9/2002 | Nakasuji et al. |
| 2003/0030007 A1 | 2/2003 | Karimata et al. |
| 2003/0209673 A1 | 11/2003 | Ono et al. |
| 2007/0228297 A1 | 10/2007 | Ogasawara |
| 2008/0231192 A1 | 9/2008 | Ogasawara |
| 2013/0248731 A1 | 9/2013 | Tanimoto et al. |
| 2014/0224999 A1 | 8/2014 | Noguchi |
| 2017/0229279 A1 | 8/2017 | Brodie et al. |
| 2019/0259564 A1 | 8/2019 | Kruit et al. |
| 2019/0259570 A1 | 8/2019 | Kruit et al. |
| 2020/0161079 A1* | 5/2020 | Ren .................. H01J 37/285 |

FOREIGN PATENT DOCUMENTS

| | | |
|---|---|---|
| JP | S6481151 A | 3/1989 |
| JP | 2001-118536 A | 4/2001 |
| JP | 2001345259 A | 12/2001 |
| JP | 2002100317 A | 4/2002 |
| JP | 2004235435 A | 8/2004 |
| JP | 2006049702 A | 2/2006 |
| JP | 2007149655 A | 6/2007 |
| JP | 2007273838 A | 10/2007 |
| JP | 4541798 B2 | 9/2010 |
| JP | 4615816 B2 | 1/2011 |
| JP | 2012238770 A | 12/2012 |
| JP | 2014033033 A | 2/2014 |
| JP | 2014186901 A | 10/2014 |
| TW | 201917767 A | 5/2019 |
| TW | 201933412 A | 8/2019 |

OTHER PUBLICATIONS

Office Action issued by the Intellectual Property Office (IPO), ROC (Taiwan) Patent Application No. 110106438, mailed on Feb. 15, 2022 (14 pgs.).

Notice of Reasons for Rejection from the Japan Patent Office issued in related Japanese Patent Application No. 2022-547118; mailed Aug. 16, 2023 (5 pgs.).

* cited by examiner

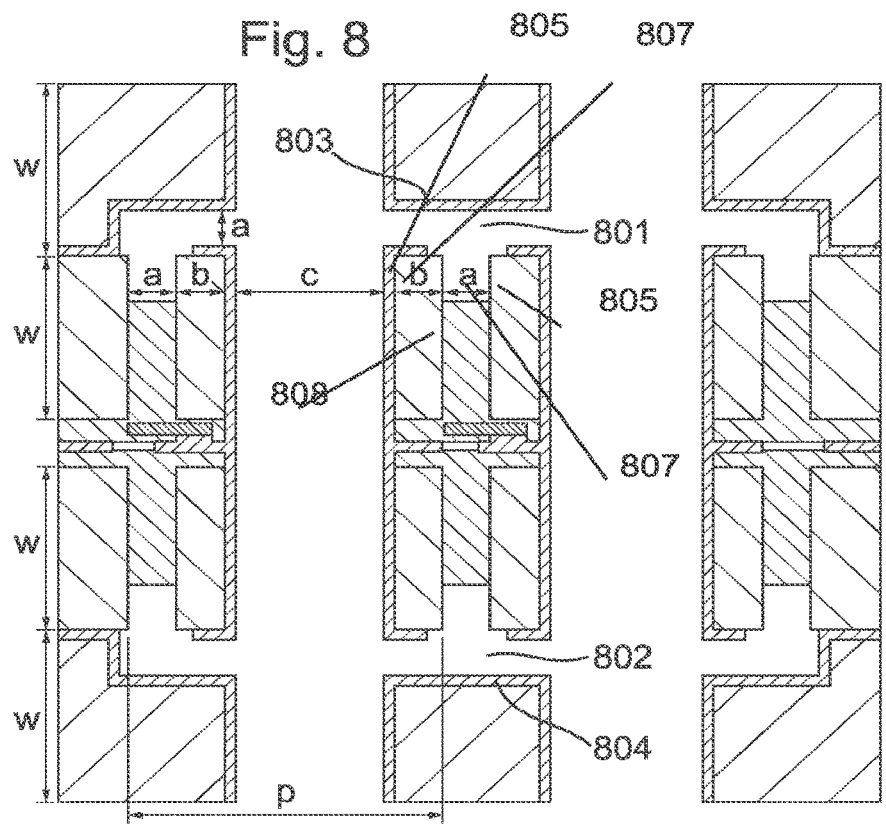
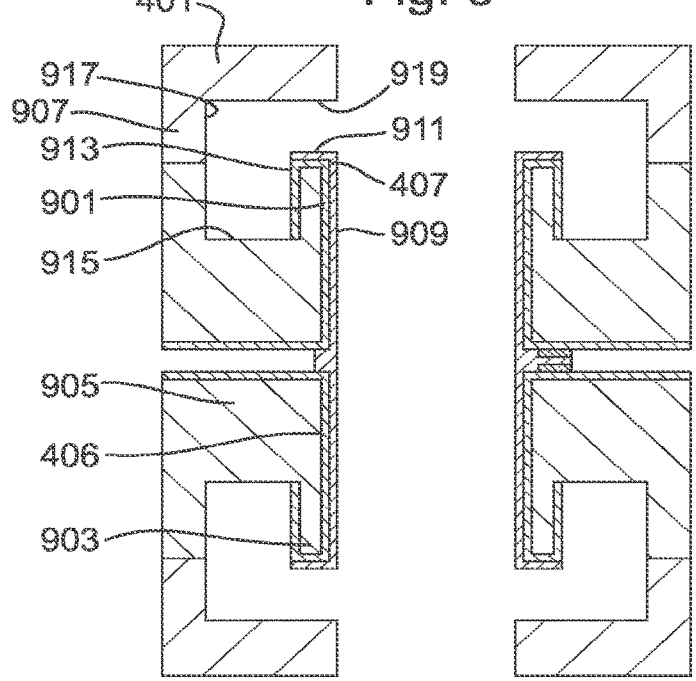

LENS DESIGNS

CROSS-REFERENCE TO RELATED APPLICATIONS

This application claims priority of International application PCT/EP2021/054008, which was filed on 18 Feb. 2021, which claims priority of EP application 20160282.8, which was filed on 28 Feb. 2020, all of which are incorporated herein by reference in their entireties.

FIELD

The embodiments provided herein generally relate to a charged particle illumination apparatus, and more particularly, to the design of beam manipulators for use within a charged particle beam illumination apparatus.

BACKGROUND

When manufacturing semiconductor integrated circuit (IC) chips, undesired pattern defects, as a consequence of, for example, optical effects and incidental particles, inevitably occur on a substrate (i.e., wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an import process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

Another application for a charged particle beam is lithography. The charged particle beam reacts with a resist layer on the surface of a substrate. A desired pattern in the resist can be created by controlling the locations on the resist layer that the charged particle beam is directed towards.

A way of improving the performance of tools for such applications is to use a charged particle beam illumination apparatus that generates a multi-beam of charged particles. By illuminating a sample with a multi-beam of charged particles, each of the sub-beams in the multi-beam effectively operate in parallel.

There is a general need to improve the performance of a charged particle beam illumination apparatus that illuminates samples with a multi-beam of charged particles by developing techniques that allow a reduction of the pitch between sub-beams of the multi-beam and/or increase to number of sub-beams that may be used.

SUMMARY

The embodiments provided herein disclose a manipulator lensing device for use in a charged particle beam illumination apparatus. The charged particle beam illumination apparatus may be used to generate a multi-beam of charged particles. The manipulator lensing device is particularly suitable for use in an array of manipulator lensing devices, with each manipulator lensing device in the array configured to operate on a respective sub-beam of a multi-beam of charged particles. The charged particle beam illumination apparatus may, for example, be comprised within an inspection apparatus or a lithography apparatus.

According to some embodiments of the present disclosure, there is provided a manipulator lensing device for focusing a beam of charged particles, wherein the manipulator lensing device comprises: a first structure through which is formed an opening wherein the path of a beam of charged particles through the manipulator lensing device is substantially along a longitudinal axis of the opening; a second structure with a surface wherein, in a plane orthogonal to the longitudinal axis and along a first portion of the longitudinal axis, the surface surrounds the opening; a support that, in a plane orthogonal to the longitudinal axis and along at least part of the first portion of the longitudinal axis, connects the second structure to the first structure and surrounds the second structure so that the connection between the second structure and the first structure is symmetric around the longitudinal axis; and an electrode arrangement provided on the surface of the second structure such that the electrode arrangement surrounds the longitudinal axis of the opening and, in a plane that is orthogonal to the longitudinal axis, the surface of the second structure surrounds the electrode arrangement; wherein: a first surface of the first structure is arranged such that, in a plane orthogonal to the longitudinal axis and along at least a second portion of the longitudinal axis of the opening, the first surface surrounds the opening; a second surface of the first structure is arranged such that, in a plane orthogonal to the longitudinal axis and along at least a third portion of the longitudinal axis, the second surface surrounds the opening; the surface of the second structure is arranged along the longitudinal axis between the first and second surfaces of the first structure; the electrode arrangement and the first surface of the first structure are separated from each other in a direction parallel to the longitudinal axis so that there is a first gap between the electrode arrangement and the first surface of the first structure; and the electrode arrangement and the second surface of the first structure are separated from each other in a direction parallel to the longitudinal axis so that there is a second gap between the electrode arrangement and the second surface of the first structure.

According to some embodiments of the present disclosure, there is provided a manipulator lensing array that comprises a plurality of manipulator lensing devices according to the first aspect; wherein the openings of all of the manipulator lensing devices are comprised by the same first structure.

According to some embodiments of the present disclosure, there is provided a method of bonding the first part of the manipulator lensing device to the second part of the manipulator lensing device.

According to some embodiments of the present disclosure, there is provided an Einzel lens for focusing a beam of charged particles, wherein the Einzel lens comprises: a focusing electrode arrangement to which a voltage for focusing a beam of charged particles is applied; a first electrode arrangement on a main body of the Einzel lens; and a second electrode arrangement on a main body of the Einzel lens, wherein, along the longitudinal axis of the Einzel lens, the focusing electrode arrangement is arranged between the first and second ground electrode arrangements and the focusing electrode arrangement is electrically isolated from both the first and second ground electrode arrangements; wherein the focusing electrode arrangement comprises: a structure on which one or more electrodes are formed; and a support that, in a plane orthogonal to the longitudinal axis, mechanically connects the structure to the main body of the Einzel lens with a connection that is symmetric around the longitudinal axis.

According to some embodiments of the present disclosure, there is provided an Einzel lens configured in use to focus a beam of charged particles in a beam path, wherein the Einzel lens comprises: a first electrode configured to be set at a first potential; a focusing electrode configured to be at a second potential, the focusing electrode extending along and symmetrically around the beam path; a second electrode configured to be substantially at the first potential; and a support configured to support the focusing electrode, wherein the focusing electrode is configured to be electrically isolated from the first and second electrodes and the focusing electrode extends further along the beam path than the support so that a dimensional difference between the support and the focusing electrode along the beam path provides a creep length parallel to the beam path.

According to some embodiments of the present disclosure, there is provided an Einzel lens configured in use to focus a beam of charged particles in a beam path, wherein the Einzel lens comprises: a first electrode configured to be set at a first potential; a focusing electrode configured to be at a second potential, wherein the focusing electrode extends along and symmetrically around the beam path and the focusing electrode comprises a pole surface on a structure; a second electrode configured to be substantially at the first potential; and a support configured to support the focusing electrode, the electrodes being arranged along the beam path such that the focusing electrode is between the first and second electrodes, wherein the focusing electrode is configured to be electrically isolated from the first and second electrodes.

According to some embodiments of the present disclosure, there is provided a multi-array Einzel lens configured in use to focus a plurality of beamlets of charged particles along a multi-beam path, wherein each Einzel lens in the array comprises: a focusing electrode that is intermediate up-beam and down-beam electrodes along the beam path and is configured to be at a potential different from the up-beam and down-beam electrodes, wherein the focusing electrode is electrically isolated from both the up-beam and down-beam electrodes; wherein the focusing electrode comprises: a pole surface; and a support; wherein the support is: substantially symmetric around the beam path; configured to support, in a plane orthogonal to the beam path, the pole surface; and configured to electrically connect the pole surface.

According to some embodiments of the present disclosure, there is provided a multi-array Einzel lens configured in use to focus a plurality of beamlets of charged particles along a multi-beam path, wherein each Einzel lens in the array comprises: a focusing electrode that is intermediate to an up-beam and down-beam electrodes and configured to be isolated from, and at a potential different from, the up-beam and down-beam electrodes, the focusing electrode extending along and substantially symmetric around the beam path; and a support configured to support the focusing electrode; wherein the focusing electrode extends further along the beam path than the support so that a dimensional difference between the support and along the beam path the focusing electrode provides a creep length parallel to the beam path.

According to some embodiments of the present disclosure, there is provided a multi-array lens configured in use to focus a plurality of beamlets of charged particles along a multi-beam path, wherein each lens in the array comprises: an entrance electrode; a focusing electrode down beam of the entrance electrode along a beamlet path and configured to be at a potential different during operation from the entrance electrode; and a support to support and electrically isolate the focusing electrode, wherein the focusing electrode is substantially rotationally symmetric around the beamlet path.

According to some embodiments of the present disclosure, there is provided a multi-array lens configured in use to focus a plurality of beamlets of charged particles along a multi-beam path, wherein each lens in the array comprises: an entrance electrode; a focusing electrode down beam of the entrance electrode along a beamlet path and configured to be at a potential different from the entrance electrode, wherein the focusing electrode comprises: a pole surface; and a support; wherein the support is: symmetric around the beamlet path; configured to support, in a plane orthogonal to the beam path, the pole surface; configured electrically to isolate the focusing electrode from the entrance electrode; and configured electrically to connect the pole surface.

According to some embodiments of the present disclosure, there is provided a multi-array Einzel lens configured in use to focus a plurality of beamlets of charged particles along a multi-beam path, wherein each Einzel lens in the array comprises: a focusing electrode intermediate to an up-beam and down-beam electrode and configured to be isolated from, and at a potential different from, the up-beam and down-beam electrodes, wherein the focusing electrode extends along and substantially symmetrically around the beam path; and a support configured to support the focusing electrode; wherein the focusing electrode extends further along the beamlet path than the support so that a dimensional difference between the support and along the beam path the focusing electrode provides a shield of the support to the beam path.

According to some embodiments of the present disclosure, there is provided a multi-array lens configured in use to focus a plurality of beamlets of charged particles along a multi-beam path, wherein each lens in the array comprises: an entrance electrode; a focusing electrode down beam of the entrance electrode along a beamlet path and configured to be at a potential different from the entrance electrode; and a support configured to support the focusing electrode relative to the entrance electrode, wherein the focusing electrode and support are configured so that in operation the lens generates a rotationally symmetrical field around the beamlet path.

Other advantages of the disclosed embodiments will become apparent from the following description taken in conjunction with the accompanying drawings wherein are set forth, by way of illustration and example, certain embodiments of the present disclosure.

BRIEF DESCRIPTION OF FIGURES

The above and other aspects of the present disclosure will become more apparent from the description of exemplary embodiments, taken in conjunction with the accompanying drawings.

FIG. 8 shows a cross-section through a lens array that comprises lenses, according to some embodiments of the present disclosure.

FIG. 9 shows a cross-section through a schematic lens design, according to some embodiments of the present disclosure.

DETAILED DESCRIPTION

Figure 1:
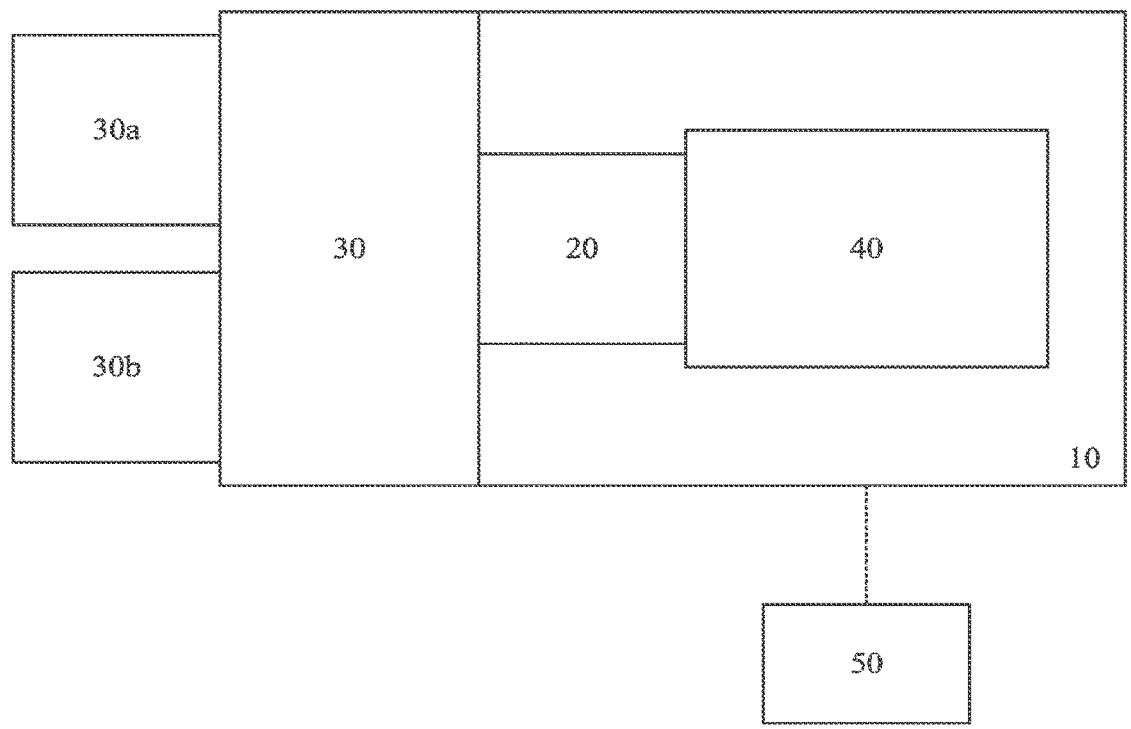
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the technology recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If an individual step has a yield of 95%, the overall process yield would be as low as 7%.

While high process yield is desirable in an IC chip manufacturing facility, maintaining a high substrate (i.e., wafer) throughput, defined as the number of substrates processed per hour, is also essential. High process yield and high substrate throughput can be impacted by the presence of a defect. This is especially if operator intervention is required for reviewing the defects. Thus, high throughput detection and identification of micro and nano-scale defects by inspection tools (such as a Scanning Electron Microscope ('SEM')) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e., a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

In a multi-beam inspection apparatus, the paths of some of the primary electron beams are displaced away from the central axis, i.e., a mid-point of the primary electron optical axis, of the scanning device. To ensure all the electron beams arrive at the sample surface with substantially the same angle of incidence, sub-beam paths with a greater radial distance from the central axis need to be manipulated to move through a greater angle than the sub-beam paths with paths closer to the central axis. This stronger manipulation may cause aberrations which result in blurry and out-of-focus images of the sample substrate. In particular, for sub-beam paths that are not on the central axis, the aberrations in the sub-beams may increase with the radial displacement from the central axis. Such aberrations may remain associated with the secondary electrons when they are detected. Such aberrations therefore degrade the quality of images that are created during inspection.

An implementation of a known multi-beam inspection apparatus is described below.

The figures are schematic. Relative dimensions of components in drawings are therefore exaggerated for clarity. Within the following description of drawings, the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50. Electron beam tool 40 is located within main chamber 10.

EFEM 30 includes a first loading port 30a and a second loading port 30b. EFEM 30 may include additional loading port(s). First loading port 30a and second loading port 30b may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure in around the sample reaches a second pressure lower than the first pressure. After reaching the second pressure, the sample is transported to the electron beam tool by which it may be inspected. An electron beam tool 40 may comprise a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
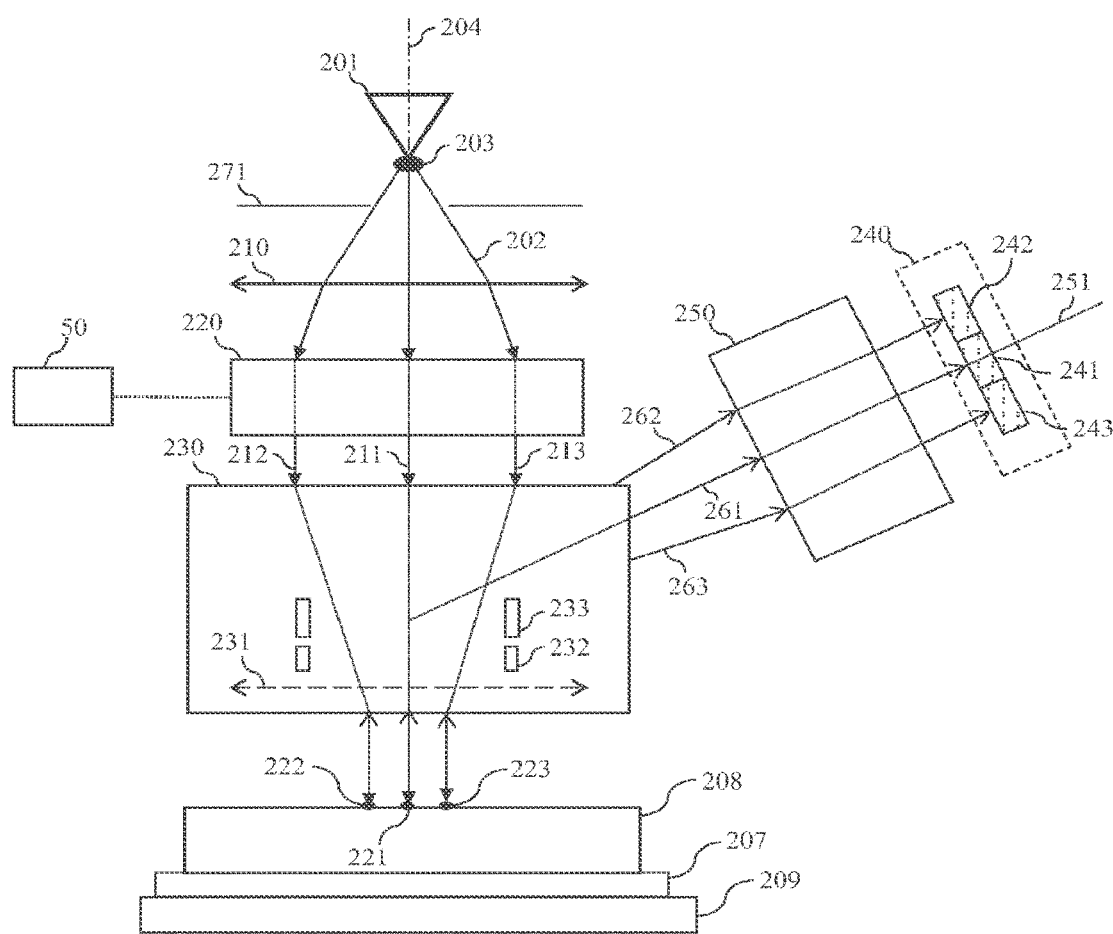
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a gun aperture plate 271, a condenser lens 210, a source conversion unit 220, a primary projection apparatus 230, a motorized stage 209, and a sample holder 207. The electron source 201, a gun aperture plate 271, a condenser lens 210, a source conversion unit 220 are the components of an illumination apparatus comprised by the multi-beam electron beam tool 40. The sample holder 207 is supported by motorized stage 209 so as to hold a sample 208 (e.g., a substrate or a mask) for inspection. Multi-beam electron beam tool 40 may further comprise a secondary projection apparatus 250 and an associated electron detection device 240. Primary projection apparatus 230 may comprise an objective lens 231. Electron detection device 240 may comprise a plurality of detection elements 241, 242, and 243. A beam separator 233 and a deflection scanning unit 232 may be positioned inside primary projection apparatus 230.

The components that are used to generate a primary beam may be aligned with a primary electron-optical axis of the apparatus 40. These components can include: the electron source 201, gun aperture plate 271, condenser lens 210, source conversion unit 220, beam separator 233, deflection scanning unit 232, and primary projection apparatus 230. Secondary projection apparatus 250 and its associated electron detection device 240 may be aligned with a secondary electron-optical axis 251 of apparatus 40.

The primary electron-optical axis 204 is comprised by the electron-optical axis of the of the part of electron beam tool 40 that is the illumination apparatus. The secondary electron-optical axis 251 is the electron-optical axis of the of the part of electron beam tool 40 that is a detection apparatus. The primary electron-optical axis 204 may also be referred to herein as the primary optical axis (to aid ease of reference) or charged particle optical axis. The secondary electron-optical axis 251 may also be referred to herein as the secondary optical axis or the secondary charged particle optical axis.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202 that forms a primary beam crossover (virtual or real) 203. Primary electron beam 202 may be visualized as being emitted from primary beam crossover 203.

In this arrangement a primary electron beam, by the time it reaches the sample, and preferably before it reaches the projection apparatus, is a multi-beam. Such a multi-beam can be generated from the primary electron beam in a number of different ways. For example, the multi-beam may be generated by a multi-beam array located before the cross-over, a multi-beam array located in the source conversion unit 220, or a multi-beam array located at any point in between these locations. A multi-beam array may comprise a plurality of electron beam manipulating elements arranged in an array across the beam path. Each manipulating element may influence the primary electron beam to generate a sub-beam. Thus the multi-beam array interacts with an incident primary beam path to generate a multi-beam path down-beam of the multi-beam array.

Gun aperture plate 271, in operation, is configured to block off peripheral electrons of primary electron beam 202 to reduce Coulomb effect. The Coulomb effect may enlarge the size of each of probe spots 221, 222, and 223 of primary sub-beams 211, 212, 213, and therefore deteriorate inspection resolution. A gun aperture plate 271 may also be referred to as a coulomb aperture array.

Condenser lens 210 is configured to focus primary electron beam 202. Condenser lens 210 may be designed to focus primary electron beam 202 to become a parallel beam and be normally incident onto source conversion unit 220.

Condenser lens 210 may be a movable condenser lens that may be configured so that the position of its first principal plane is movable. The movable condenser lens may be configured to be magnetic. Condenser lens 210 may be an anti-rotation condenser lens and/or it may be movable.

Source conversion unit 220 may comprise an image-forming element array, an aberration compensator array, a beam-limit aperture array, and a pre-bending micro-deflector array. The pre-bending micro-deflector array may deflect a plurality of primary sub-beams 211, 212, 213 of primary electron beam 202 to normally enter the beam-limit aperture array, the image-forming element array, and an aberration compensator array. In this arrangement, the image-forming element array may function as a multi-beam array to generate the plurality of sub-beams in the multi-beam path, i.e., primary sub-beams 211, 212, 213. The image forming array may comprise a plurality electron beam manipulators such as micro-deflectors micro-lenses (or a combination of both) to influence the plurality of primary sub-beams 211, 212, 213 of primary electron beam 202 and to form a plurality of parallel images (virtual or real) of primary beam crossover 203, one for each of the primary sub-beams 211, 212, and 213. The aberration compensator array may comprise a field curvature compensator array (not shown) and an astigmatism compensator array (not shown). The field curvature compensator array may comprise a plurality of micro-lenses to compensate field curvature aberrations of the primary sub-beams 211, 212, and 213. The astigmatism compensator array may comprise a plurality of micro-stigmators to compensate astigmatism aberrations of the primary sub-beams 211, 212, and 213. The beam-limit aperture array may be configured to limit diameters of individual primary sub-beams 211, 212, and 213. FIG. 2 shows three primary sub-beams 211, 212, and 213 as an example, and it should be understood that source conversion unit 220 may be configured to form any number of primary sub-beams. Controller 50 may be connected to various parts of charged particle beam inspection apparatus 100 of FIG. 1, such as source conversion unit 220, electron detection device 240, primary projection apparatus 230, or motorized stage 209. As explained in further detail below, controller 50 may perform various image and signal processing functions. Controller 50 may also generate various control signals to govern operations of the charged particle beam inspection apparatus, including the charged particle multi-beam apparatus.

Condenser lens 210 may further be configured to adjust electric currents of primary sub-beams 211, 212, 213 downbeam of source conversion unit 220 by varying the focusing power of condenser lens 210. Alternatively, or additionally, the electric currents of the primary sub-beams 211, 212, 213 may be changed by altering the radial sizes of beam-limit apertures within the beam-limit aperture array corresponding to the individual primary sub-beams. The electric currents may be changed by both altering the radial sizes of beam-limit apertures and the focusing power of condenser lens 210. If the condenser lens is moveable and magnetic, off-axis sub-beams 212 and 213 may result that illuminate source conversion unit 220 with rotation angles. The rotation angles change with the focusing power or the position of the first principal plane of the movable condenser lens. A condenser lens 210 that is an anti-rotation condenser lens may be configured to keep the rotation angles unchanged while the focusing power of condenser lens 210 is changed. Such a condenser lens 210 that is also movable, may cause the rotation angles not change when the focusing power of the condenser lens 210 and the position of its first principal plane are varied.

Objective lens 231 may be configured to focus sub-beams 211, 212, and 213 onto a sample 208 for inspection and may form three probe spots 221, 222, and 223 on the surface of sample 208.

Beam separator 233 may be, for example, a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary sub-beams 211, 212, and 213. The electrostatic force is equal in magnitude but opposite in direction to the magnetic force exerted by magnetic dipole field of beam separator 233 on the individual electrons. Primary sub-beams 211, 212, and 213 may therefore pass at least substantially straight through beam separator 233 with at least substantially zero deflection angles.

Deflection scanning unit 232, in operation, is configured to deflect primary sub-beams 211, 212, and 213 to scan probe spots 221, 222, and 223 across individual scanning areas in a section of the surface of sample 208. In response to incidence of primary sub-beams 211, 212, and 213 or probe spots 221, 222, and 223 on sample 208, electrons are generated from the sample 208 which include secondary electrons and backscattered electrons. The secondary electrons propagate in three secondary electron beams 261, 262, and 263. The secondary electron beams 261, 262, and 263 typically have secondary electrons (having electron energy ≤50 eV) and may also have at least some of the backscattered electrons (having electron energy between 50 eV and the landing energy of primary sub-beams 211, 212, and 213). The beam separator 233 is arranged to deflect the path of the secondary electron beams 261, 262, and 263 towards the secondary projection apparatus 250. The secondary projection apparatus 250 subsequently focuses the path of secondary electron beams 261, 262, and 263 onto a plurality of detection regions 241, 242, and 243 of electron detection device 240. The detection regions may be the separate detection elements 241, 242, and 243 that are arranged to detect corresponding secondary electron beams 261, 262, and 263. The detection regions generate corresponding signals which are sent to controller 50 or a signal processing system (not shown), e.g., to construct images of the corresponding scanned areas of sample 208.

The detection elements 241, 242, and 243 may detect the corresponding secondary electron beams 261, 262, and 263. On incidence of secondary electron beams with the detection elements 241, 242 and 243, the elements may generate corresponding intensity signal outputs (not shown). The outputs may be directed to an image processing system (e.g., controller 50). Each detection element 241, 242, and 243 may comprise one or more pixels. The intensity signal output of a detection element may be a sum of signals generated by all the pixels within the detection element.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control motorized stage 209 to move sample 208 during inspection of sample 208. The controller 50 may enable motorized stage 209 to move sample 208 in a direction, preferably continuously, for example at a constant speed, at least during sample inspection. The controller 50 may control movement of the motorized stage 209 so that it changes the speed of the movement of the sample 208 dependent on various parameters. For example, the controller may control the stage speed (including its direction) depending on the characteristics of the inspection steps of scanning process.

Although FIG. 2 shows that apparatus 40 uses three primary electron sub-beams, it is appreciated that apparatus 40 may use two or more number of primary electron sub-beams. The present disclosure does not limit the number of primary electron beams used in apparatus 40.

Figure 3:
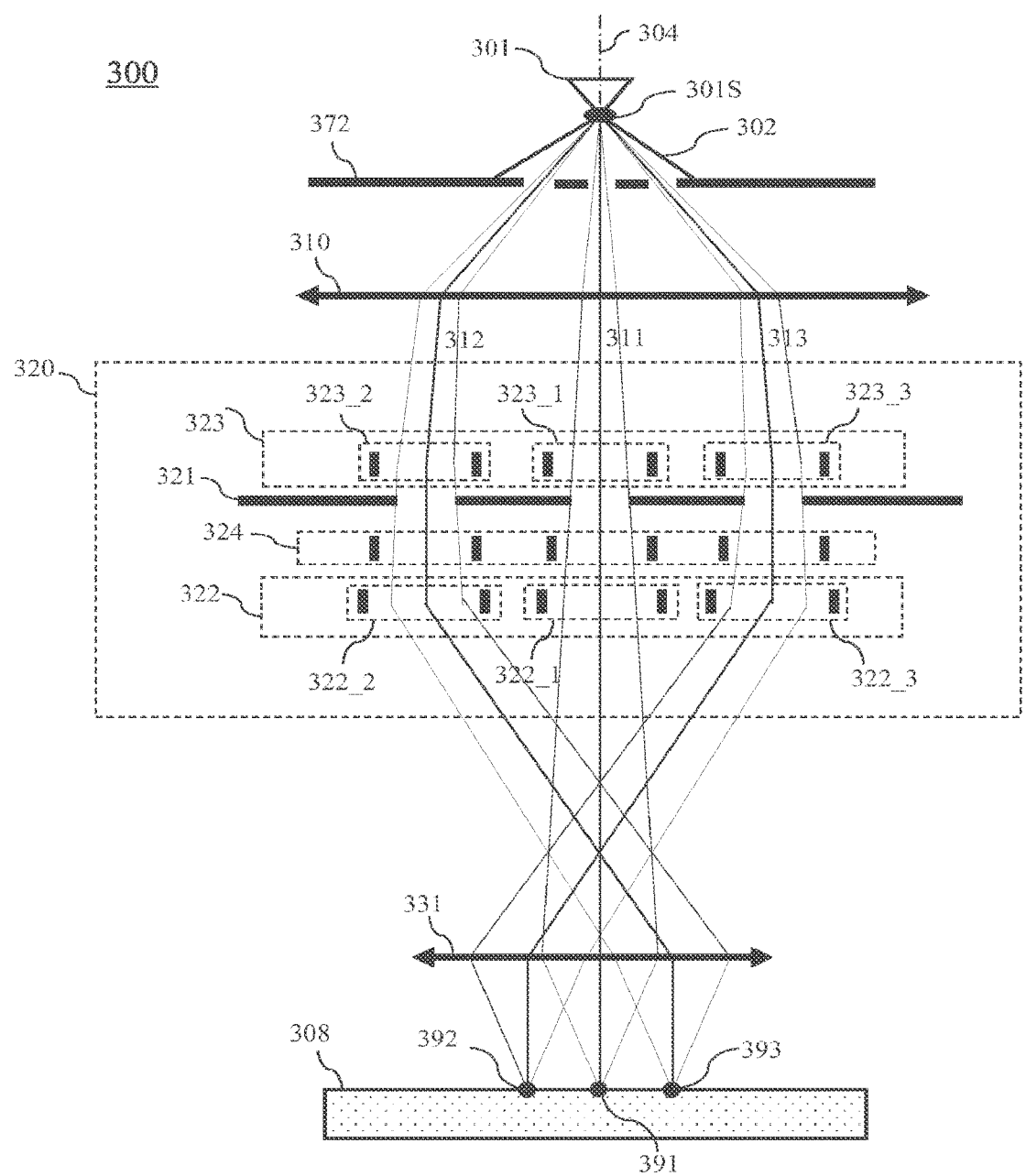
FIG. 3 is a schematic diagram of exemplary multi-beam apparatus illustrating an exemplary configuration of source conversion unit of the exemplary charged particle beam inspection apparatus of FIG. 1.

Reference is now made to FIG. 3, which is a schematic diagram of exemplary multi-beam apparatus illustrating an exemplary configuration of source conversion unit of the exemplary charged particle beam inspection apparatus of FIG. 1. The apparatus 300 may comprise an election source 301, a pre-sub-beam-forming aperture array 372, a condenser lens 310 (similar to condenser lens 210 of FIG. 2), a source conversion unit 320, an objective lens 331 (similar to objective lens 231 of FIG. 2), and a sample 308 (similar to sample 208 of FIG. 2). The election source 301, a pre-sub-beam-forming aperture array 372, a condenser lens 310 may be the components of an illumination apparatus comprised by the apparatus 300. The source conversion unit 320, an objective lens 331 may the components of a projection apparatus comprised by the apparatus 300. The source conversion unit 320 may be similar to source conversion unit 220 of FIG. 2 in which the image-forming element array of FIG. 2 is image-forming element array 322, the aberration compensator array of FIG. 2 is aberration compensator array 324, the beam-limit aperture array of FIG. 2 is beam-limit aperture array 321, and the pre-bending micro-deflector array of FIG. 2 is pre-bending micro-deflector array 323. The election source 301, the pre-sub-beam-forming aperture array 372, the condenser lens 310, the source conversion unit 320, and the objective lens 331 are aligned with a primary electron-optical axis 304 of the apparatus. The electron source 301 generates a primary-electron beam 302 generally along the primary electron-optical axis 304 and with a source crossover (virtual or real) 301S. The pre-sub-beam-forming aperture array 372 cuts the peripheral electrons of primary electron beam 302 to reduce a consequential Coulomb effect. The Coulomb effect is a source of aberration to the sub-beams due to interaction between electrons in different sub-beam paths. Primary-electron beam 302 may be trimmed into a specified number of sub-beams, such as three sub-beams 311, 312 and 313, by pre-sub-beam-forming aperture array 372 of a pre-sub-beam-forming mechanism. Although three sub-beams and their paths are referred to in the previous and following description, it should be understood that the description is intended to apply an apparatus, tool, or system with any number of sub-beams.

The source conversion unit 320 may include a beamlet-limit aperture array 321 with beam-limit apertures configured to limit the sub-beams 311, 312, and 313 of the primary electron beam 302. The source conversion unit 320 may also include an image-forming element array 322 with image-forming micro-deflectors, 322_1, 322_2, and 322_3. There is a respective micro-deflector associated with the path of each sub-beam. The micro-deflectors 322_1, 322_2, and 322_3 are configured to deflect the paths of the sub-beams 311, 312, and 313 towards the electron-optical axis 304. The deflected sub-beams 311, 312 and 313 form virtual images of source crossover 301S. The virtual images are projected onto the sample 308 by the objective lens 331 and form probe spots thereon, which are the three probe spots, 391, 392, and 393. Each probe spot corresponds to the location of incidence of a sub-beam path on the sample surface. The source conversion unit 320 may further comprise an aberration compensator array 324 configured to compensate aberrations of each of the sub-beams. The aberrations in each sub-beam are typically present on the probe spots, 391, 392, and 393 that would be formed a sample surface. The aberration compensator array 324 may include a field curvature compensator array (not shown) with micro-lenses. The field curvature compensator and micro-lenses are configured to compensate the sub-beams for field curvature aberrations evident in the probe spots, 391, 392, and 393. The aberration compensator array 324 may include an astigmatism compensator array (not shown) with micro-stigmators. The micro-stigmators are controlled to operate on the sub-beams to compensate astigmatism aberrations that are otherwise present in the probe spots, 391, 392, and 393.

The source conversion unit 320 may further comprise a pre-bending micro-deflector array 323 with pre-bending micro-deflectors 323_1, 323_2, and 323_3 to bend the sub-beams 311, 312, and 313 respectively. The pre-bending micro-deflectors 323_1, 323_2, and 323_3 may bend the path of the sub-beams onto the beamlet-limit aperture array 321. The sub-beam path of the incident on beamlet-limit aperture array 321 may be orthogonal to the plane of orientation of the beamlet-limit aperture array 321. The condenser lens 310 may direct the path of the sub-beams onto the beamlet-limit aperture array 321. The condenser lens 310 may focus the three sub-beams 311, 312, and 313 to become parallel beams along primary electron-optical axis 304, so that it is perpendicularly incident onto source conversion unit 320, which may correspond to the beamlet-limit aperture array 321.

The image-forming element array 322, the aberration compensator array 324, and the pre-bending micro-deflector array 323 may comprise multiple layers of sub-beam manipulating devices, some of which may be in the form or arrays, for example: micro-deflectors, micro-lenses, or micro-stigmators.

In source the conversion unit 320, the sub-beams 311, 312 and 313 of the primary electron beam 302 are respectively deflected by the micro-deflectors 322_1, 322_2 and 322_3 of image-forming element array 322 towards the primary electron-optical axis 304. It should be understood that the sub-beam 311 path may already correspond to the electron-optical axis 304 prior to reaching micro-deflector 322_1, accordingly the sub-beam 311 path may not be deflected by micro-deflector 322_1.

The objective lens 331 focuses the sub-beams onto the surface of the sample 308, i.e., it projects the three virtual images onto the sample surface. The three images formed by three sub-beams 311 to 313 on the sample surface form three probe spots 391, 392 and 393 thereon. The deflection angles of sub-beams 311 to 313 are adjusted by the objective lens 311 to reduce the off-axis aberrations of three probe spots 391~393. The three deflected sub-beams consequently pass through or approach the front focal point of objective lens 331.

At least some of the above-described components in FIG. 2 and FIG. 3 may individually, or in combination with each other, be referred to as a manipulator array, or manipulator, because they manipulate one or more beams, or sub-beams, of charged particles.

The above-described multi-beam inspection tool comprises a multi-beam charged particle optical apparatus with a single source of charged particles. The charged particle optical apparatus comprises an illumination apparatus and a projection apparatus. The illumination apparatus may generate a multi-beam of charged particles from the beam of electrons from the source. The projection apparatus projects a multi-beam of charged particles towards a sample. At least part of the surface of a sample may be scanned with the multi-beam of charged particles.

Embodiments provide new designs of a lens for use in an illumination apparatus and/or projection apparatus of charged particles. The lens may manipulate a beam, or sub-beam, of charged particles by focusing, or de-focusing, the beam.

A lens according to embodiments is particularly appropriate for use in an array of lenses. The lens has a compact design and so lenses within an array may be located close to each other. In an array of lenses according to some embodiments, the beam of charged particles that is manipulated by each lens may be a sub-beam of a multi-beam of charged particles.

Each lens according to embodiments may be referred to as a manipulator lensing device and/or a micro-lens.

Figure 4:
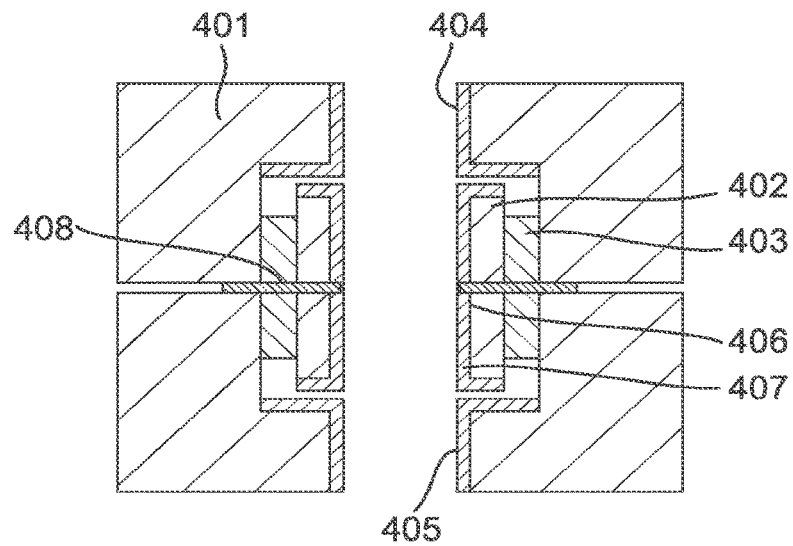
FIG. 4 shows a cross-section through a schematic lens design, according to some embodiments of the present disclosure.

FIG. 4 shows a cross-section through a lens design, according to some embodiments. The cross-section is in a plane that is incudes the path of a beam of charged particles through the lens. Typically the beam path would be from the top to the bottom of the page.

The lens may be comprised of substrate. The lens may be formed in at least two layers of a semiconductor substrate. However, as described in more detail later, the lens may be formed in at least four layers of a semiconductor substrate.

The lens comprises a first structure 401 within which an opening is formed. In plan view, the opening may be circular. The opening is an aperture for a path of a beam of charged particles through the lens. The lens is arranged to manipulate, for example focus or de-focus, charged particles that travel through the opening. The path of charged particles through the opening may be substantially along, and/or parallel to, the longitudinal axis of the opening, for example if the multi-beam paths are substantially collimated prior to entering the lenses of a multi-lens array. Alternatively, the path of charged particles through the opening may be at an angle relative to the longitudinal axis of the opening. The longitudinal axis of the opening may be parallel to the charged particle optical axis of the part of the apparatus/tool that the lens is used in.

The first structure 401 may comprise a plurality of layers of a semiconductor substrate. For example, the first structure 401 may comprise at least four layers of a semiconductor substrate.

The first structure 401 comprises a first surface 404 that provides a wall of the opening that extends in a direction along the longitudinal axis of the opening from a first end of the opening. The first surface 404 may be at an up-beam end of the first structure 401. The first surface 404 may be an electrode arrangement that comprises one or more electrodes. The first surface 404 may provide a ground potential.

The first structure 401 comprises a second surface 405 that provides a wall of the opening that extends in a direction along the longitudinal axis of the opening from a second end of the opening. The second surface 405 may be at a down-beam end of the first structure 401. The second end of the opening is opposite the first end of the opening. The second surface 405 may be an electrode arrangement that comprises one or more electrodes. The second surface 405 may provide a ground potential.

Both the first surface 404 and the second surface 405 may be at the same potential and this may be the ground potential, or a different potential from the ground potential. Alternatively, the potential of the first surface 404 may be at a different potential than the second surface 405. The first surface 404 and second surface 405 may be at any potential and are not restricted to being at the ground potential.

The lens comprises a second structure 402. The second structure 402 may be annular such that, in a plane orthogonal to the longitudinal axis of the opening and along a first portion of the longitudinal axis of the opening, the second structure 402 surrounds the opening.

The second structure 402 comprises a surface 406. An electrode arrangement 407 is provided on the surface 406 of the second structure 402. The electrode arrangement 407 provides a wall of the opening that extends in a direction along the longitudinal axis of the opening. In a plane that is orthogonal to the longitudinal axis, the electrode arrangement 407 surrounds the opening and the surface of the second structure 402 surrounds the electrode arrangement 407.

The electrode arrangement 407 may comprise one or more electrodes. Each electrode of the electrode arrangement 407 may provide a potential that is different from both the potential of the first surface 404 and the potential of the second surface 405. By applying a different potential at the electrode arrangement 407 from that applied at the first surface 404 and the second surface 405, the lens can manipulate a beam of charged particles according to the known operating principles of an Einzel lens. That is, when operating as an Einzel lens, the first and second surfaces have a common potential and the surface of the one or more electrodes of the electrode arrangement have a different potential than the first and second surfaces.

As shown in FIG. 4, electrode arrangement 407 on the second structure 402 may extend, in at least one plane orthogonal to the longitudinal axis of the opening over both ends of the second structure 402. The electrode arrangement 407 may alternatively extend over just one end of the second structure 402.

The second structure 402 is physically attached to the first structure 401 by a support 403. The support 403 may be annular such that, in a plane orthogonal to the longitudinal axis of the opening and along at least part of the first portion of the longitudinal axis, the support 403 surrounds the second structure 402. The support 403 provides a connection between the second structure 402 and the first structure 401 that is uniform and/or symmetric around the longitudinal axis of the opening.

As shown in FIG. 4, along the longitudinal axis, the extent of the support 403 may be less than the extent of the surface of the second structure 402. The longitudinal mid-point of the support 403 may be in the same plane as the longitudinal mid-point of the second structure 402.

The lens comprises a feedline 408 of the electrode arrangement 407 on the second structure 402. The feedline 408 may be provided in a plane that is orthogonal to longitudinal axis of the opening and part, or all, of the feedline 408 may surround the opening. The feedline 408 is at least electrically connected to the electrode arrangement 407 and may also be physically connected to the electrode arrangement 407. The connection of the feedline 408 to the electrode arrangement 407 may be at the longitudinal mid-point of the electrode arrangement 407, which may also be the longitudinal mid-point of the second structure 402. The feedline 408 may connect to the electrode arrangement 407 by passing, in a plane orthogonal to the longitudinal axis, through the support 403 and into the second structure 402.

The first surface 404 of the first structure 401, in a plane orthogonal to the longitudinal axis of the opening and along at least a second portion of the longitudinal axis of the opening, surrounds the opening.

The second surface 405 of the first structure 401, in a plane orthogonal to the longitudinal axis of the opening and along at least a third portion of the longitudinal axis of the opening, surrounds the opening.

Along the longitudinal axis of the opening, the electrode arrangement 407 on the surface of the second structure 402 is arranged between the first and second surfaces of the first structure 401.

The electrode arrangement 407 on the surface of the second structure 402 is separated from the first surface 404 of the first structure 401 in a direction parallel to the longitudinal axis of the opening. There is therefore a first gap between the electrode arrangement 407 and the first surface 404 of the first structure 401. The surfaces of the gap, for example orthogonal to the beam path, may provide a surface of the electrode arrangement 407 and a second surface 404 of the first structure that face each other.

The electrode arrangement 407 on the surface of the second structure 402 is separated from the second surface of the first structure 401 in a direction parallel to the longitudinal axis of the opening. There is therefore a second gap between the electrode arrangement 407 and the second surface of the first structure 401. The surfaces of the gap, for example orthogonal to the beam path, may provide a surface of the electrode arrangement 407 and a second surface 405 of the first structure 401.

The electrode arrangement 407 on the second structure 402 is physically separated from the first and second surfaces at least because of the first and second gaps. The length of each of the first and second gaps are determined such that, when the lens is use under the intended operating conditions, the electrode arrangement 407 on the second structure 402 is electrically isolated from the first and second surfaces. That is the electrode arrangement 407 is connected via the electrically insulating support to the other conductive bodies of the lens arrangement, such as the first structure 401.

The lens may be substantially symmetric around the longitudinal axis of the opening.

The overall structure of the lens is that of an Einzel lens. In such an Einzel lens the up-beam and down-beam electrodes have substantially the same potential and the intermediate electrode has a different potential. Such a difference in potential enables the beam to leave and depart from the Einzel lens with substantially the same energy or speed, and the intermediate electrode to achieve a focusing effect on the beam. Thus, a difference in potential between the electrode arrangement 407 on the second structure 402 and the first and second surfaces of the first structure 401 may have a focusing effect on charged particles that are travelling through the opening.

The second structure 402 is connected to the first structure 401 by the support 403 and the support 403 may be an electrical insulator. In particular, the support 403 may be a dielectric. The second structure 402 is thereby electrically insulated from the first structure 401 by the support 403.

The second structure 402 may be considered a main body comprising a substrate with the electrode arrangement 407 of the second structure 402 provided on the surface of the substrate.

The lens may be considered as comprising a first lens part and a second lens part. The first and second lens parts are respectively defined as being above and below the plane comprising the feedline as shown in FIG. 4. Accordingly, the first lens part on one side of a plane that is orthogonal to the longitudinal axis of the opening and is substantially at the longitudinal position of the feedline 408. The first lens part may not include the feedline 408, may include at least part of the feedline 408 or may include all of the feedline 408. The second lens part is on the other side of the plane to the first lens part. The second lens part may not include the feedline 408, may include at least part of the feedline 408 or may include all of the feedline 408.

A way of manufacturing the lens is to separately manufacture the first and second lens parts of the lens and then to bond the first and second lens parts together so as to form the lens.

Each of the first and second lens parts may be substantially identical to each other. However, embodiments also include lens designs in which the first and second lens parts differ from each other. The lens parts may be non-symmetric up beam and down-beam of the feedline. The lens may be non-symmetric about its feedline 408.

The first and send parts may be manufactured in one of more layers of substrate using known semiconductor manufacturing processes.

The first and second lens parts may be bonded together using any of a number of known techniques. Beneficially, FIG. 4 as shown and described provides s a lens with disclosed geometry of the electrode arrangement 407 and support 403 configured and arranged to generate in operation a rotationally symmetrical electric field around the beamlet path.

Figure 5:
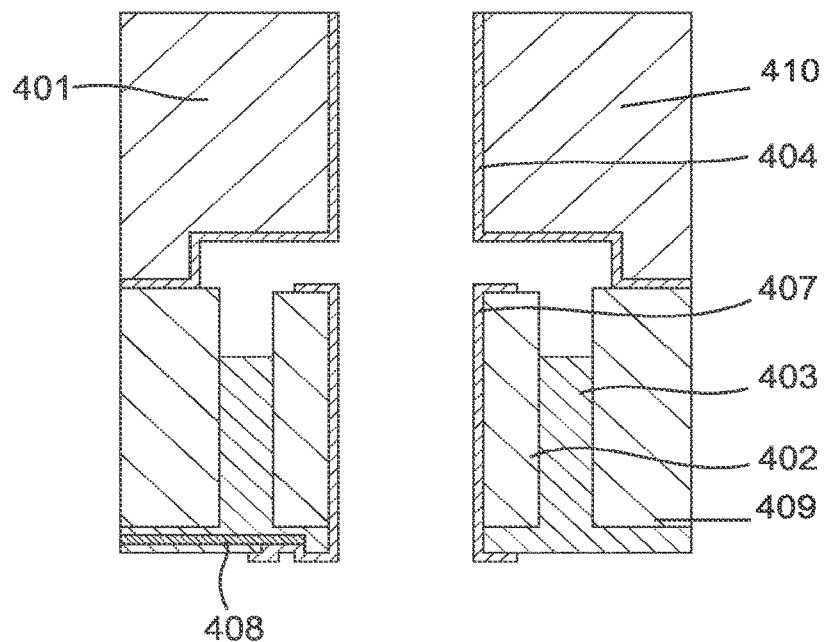
FIG. 5 shows a cross-section through a schematic lens design, according to some embodiments of the present disclosure.

FIG. 5 shows the first lens part according to a more detailed description, or an alternative implementation with respect to FIG. 4. In the lens design according to FIG. 5, the second structure 402 and the substrate element 409 of the first structure 401 in the same plane as the second structure 402 may be made from the same one or more layers of a substrate that are a first set of one or more layers of substrate. The substrate element 410 of the first structure 401 that is in a different plane from the second structure 402 may be made from a second set of one or more layers of substrate. The first surface 404 may comprise an electrode that extends into the first structure 401 at the boundary between the first and second sets of layers. The part 410 may provide an entrance electrode 404 of the lens.

The second lens part may be substantially the same as the first lens part. The first and second lens parts may be either side of the feedline. In an arrangement, the first and second lens parts may be substantial mirror images of each other about the feedline. A lens according to the present implementation may be made by bonding together the first and second lens parts. The second lens part may feature a corresponding substrate element 410 that is in a different plane than the second structure 402 of the second lens part. The substrate element 410 may comprise a substrate. The substrate element 410 of the second lens part may have a first surface 404 that in operation provides an electrode that is an exit electrode of the lens.

Figure 6:
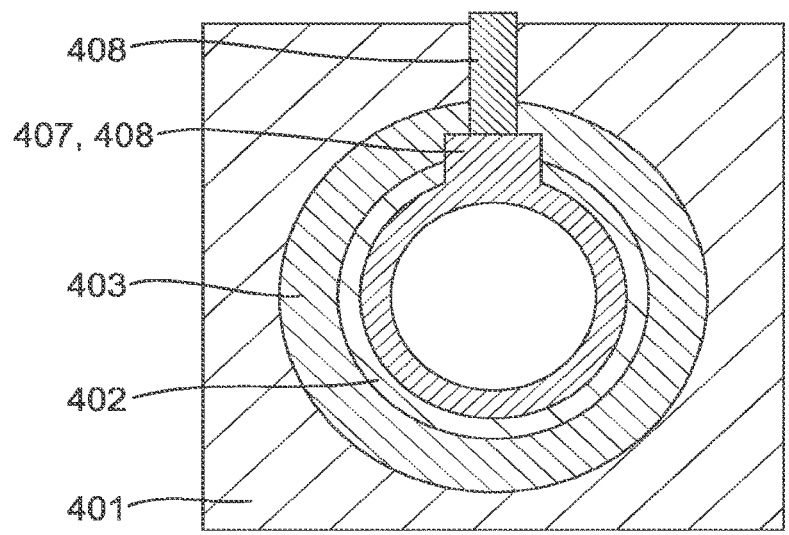
FIG. 6 is a schematic plan view that shows a cross-section through a lens, according to some embodiments of the present disclosure.

FIG. 6 is a schematic plan view that shows a cross-section through a lens according to the present implementation of previously described embodiments. The cross-section is in a plane that is orthogonal to the longitudinal axis of the opening and at the feedline 408. It is clear that within the cross-section the electrode arrangement 407 entirely surrounds the opening. The second structure 402 surrounds the electrode arrangement 407. The support 403 surrounds the second structure 402. The first structure 401 surrounds the support 403.

The lens design has a number of advantageous properties.

The first surface 404, second surface 405 and electrode arrangement 407 on the second structure 402, are rotationally uniform/symmetric around the longitudinal axis. These are the main exposed surfaces of the lens that the charged particles in the opening are primarily influenced by. Charged particles travelling through the opening of the lens are therefore not inherently manipulated in an asymmetric way due to an asymmetric lens design.

The insulator that provides the support 403 electrically insulates the second structure 402 from the first structure 401. In an arrangement the first structure 401 may include a substrate body 409 and an entrance body 410. The support 403 may electrically insulate but mechanically connect the second structure 402 to the substrate body 409. A problem with the use of insulator, that may be a dielectric, is that charge may build-up on the surface of the insulator. This can affect the path of charged particles through the lens.

A creep length may be defined as a distance over a separating surface, such as an insulating surface, between two electrode surfaces that are at a potential difference relative to each other. The electrode surfaces need to be separated from each other by at least a minimum required creep length in order for the electrode surfaces to be electrically isolated from each other. If the electrode surfaces are not separated from each other by at least the minimum required creep length, a leak flow of current may flow from one electrode surface, across the separating surface and to the other electrode surface. The minimum required creep length may be dependent on the potential differences between the electrode surfaces. The actual creep length between adjacent electrode surfaces may therefore restrict the potential difference that may be applied between the electrode surfaces. Thus, the creep length my determine the radial dimension of the support 403. The radial dimension of the gap between the second structure 402 and the substrate body 409 may at least in part be determined by the properties of a vacuum gap between the second structure 402 and the substrate body above the support 403. The vacuum gap has a radial dimensional requirement which is different from the creep length. The vacuum gap is desirably radially dimensioned so that the operating potential difference between the substrate body 409 and the second structure does not exceed the break-down voltage or field. There is a risk of electrical discharge between the substrate body 409 and the second structure 402 when the operating potential difference is above the break-down voltage for a gap of a specific dimension.

The lens designs according to embodiments may have a geometry that that separates the surfaces of electrodes, for example surfaces 407 and 404, with a number of orthogonally aligned separating surfaces (e.g., both horizontally and vertically aligned separating surfaces). Advantageously, this allows a relatively long creep length to be achieved between the surfaces of adjacent electrodes. The creep length therefore allows adjacent electrode surfaces to be operated at a relatively large potential difference. Note, that in the arrangements shown in FIGS. 4 and 5, the only depicted surface with a creep length requirement is a radial surface. This surface would be the surface of the support 403 with the vacuum gap extending between the second structure 402 and the substrate body 409.

The geometry of the lens designs according to embodiments may also reduce the effect of the exposed surface of the insulator on charged particles travelling through the opening. The insulator is substantially shielded from electron beams travelling through the opening due to the larger longitudinal extent of the second structure 402 than the support 403. The second structure 402 may prevent a line-of-sight path for charged particles between the insulator and the opening. The second structure 402 has greater longitudinal length than the insulating support 403.

The lens comprises a feedline 408 that may be substantially at the longitudinal mid-point of the second structure 402. The connection of the feedline 408 to the electrode arrangement 407 may entirely surround the electrode arrangement 407. The feedline 408 is entirely covered, by the support 403 and second structure 402. This prevents the feedline 408 from directly affecting charged particles travelling through the opening. Advantageously, this way of providing a feedline 408 does not break the symmetry around the axis of the structure of the exposed surfaces of the lens.

The lens design is also compact and suitable for use in a dense array of lenses, i.e., a dense lens array. Such lenses may be common substrates so that the array is comprised in a plurality of substrates for example as layers. More lenses can therefore be used to fill a lens array of a certain size. The beam arrangement may have a dense packing structure such as a hexagonal close pack. The pitch between lenses in the array may be smaller than in known lens designs.

A lens array comprises a plurality of lenses. Each of the lenses in the array may be arranged to focus a different sub-beam of a multi-beam of charged particles. The longitudinal axes of all of the openings of the lenses in the array may be substantially parallel with each other. All of the sub-beams in the multi-beam may be collimated and the path of each sub-beam along, or parallel to the longitudinal axis of an opening. However, embodiments also include the sub-beams within the multi-beam being either divergent, or convergent, and some, or all, of the paths of the sub-beams being at an angle relative to the longitudinal axes of the corresponding openings.

One or more layers of all of the lenses in a lens array may be formed in the same corresponding one or more layers of substrate.

Figure 7:
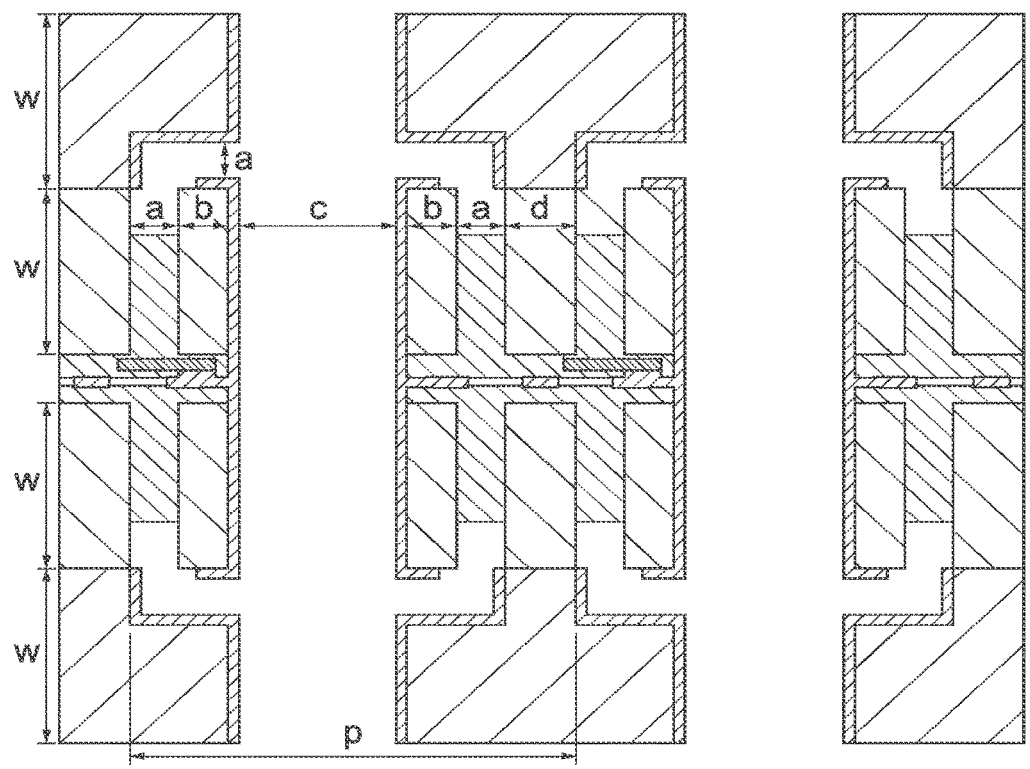
FIG. 7 shows a cross-section through a lens array, according to some embodiments of the present disclosure.

FIG. 7 shows a cross-section through a lens array. FIG. 7 shows two lenses of the lens array, with each lens being a lens according to previously described embodiments. The cross-section is in a plane that incudes the paths of charged particles through the lenses. The lens design allows the pitch, i.e., spacing, between the adjacent lenses to be relatively small. Accordingly, a dense lens array can be provided.

The opening of each lens in the array is entirely surrounded, or even encircled, by part of the first structure 401 such that each lens in the array is separated from all adjacent lenses in the array by the part of the first structure 401 that the lens's opening is formed in. Advantageously, this substantially reduces, or prevents, potential cross-talk occurring between adjacent sub-beams.

The electrode arrangement 407 may be made from, for example, Gold. An advantage of using Gold is that it is easy to sputter and does not oxidize in air.

The second structure 402 may be made from, for example, Silicon, SiC, Ge, other group IV semiconductors or other known substrate materials.

The support 403 may be made from, for example, Silicon Dioxide or any other insulating material.

The first structure 401 may be made from, for example, Silicon, SiC, Ge, other group IV semiconductors or other known substrate materials.

The feedline 408 may be made from, for example, Aluminium.

In an example of FIG. 7, dimension 'a' may be about 30 μm. Dimension 'a' corresponds to the dimension of the first gap in the direction of the beam path. Dimension 'a' may also correspond to the radial width of the support in the plane orthogonal to the beam path, however the radial width of the support may also have a different radial width. Dimension 'b', which is the width of the second structure 402 in a plane orthogonal to the path of the charged particle beam, may be about 10-15 μm. Dimension 'c', which is the width, or diameter, of the opening, may be about 140 μm. Dimension 'd', which is the shortest separation between adjacent lenses, may be about 15 μm; and dimension 'w' is the thickness of a substrate. This may be about 250 μm to 300 μm. All of the substrates may have the same thickness. Alternatively, some of the substrates may have different thicknesses.

The above-provided dimensions are approximate and embodiments may include dimensions within a ±20% range, or a larger range, of the above-provided values. The minimum values of dimensions 'b' and 'd' may be restricted by the limits of the manufacturing process. Dimension 'c' may be limited by the performance requirement of the lens. Generally speaking, decreasing 'c' below a certain value will result in an increase in aberrations. The minimum value of dimension 'a' may be restricted by the operational requirements of the lens, for example in terms of the minimum creep length and/or the minimum dimension to avoid flashover. For example, if the first gap is required to withstand a potential difference of 1000V, then the minimum value of dimension 'a' may be 45 μm. However, if the first gap is required to withstand a potential difference of 100V, then the minimum value of dimension 'a' may be 3 μm with the value of dimension 'a' limited by vacuum flashover.

The pitch between adjacent lenses is the separation, in the plane of each lens, between the longitudinal axes of the openings, which may be orthogonal to intended beam paths. The dimensional contributions to the pitch include a, b and c. The electrode arrangement, and its associated insulation, of each of adjacent lenses contribute to the pitch. The dimensional contributions a and b should therefore be considered twice when determining the pitch. In an example, the minimal pitch is in the range:

$$p=2a+2b+c+d=\text{about } 235 \text{ μm to } 245 \text{ μm}.$$

FIG. 8 shows another lens array that comprises lenses according to some embodiments of the present disclosure. The design of a lens according to FIG. 8 differs from the design of a lens according to FIG. 4 in that, when the lenses according to FIG. 8 are formed in a lens array, the opening of each lens is not entirely surrounded by part of the first structure 401. For adjacent lenses in a lens array, the first gap of each lens is comprised by a first channel 801. The first channel 801 extends within the first structure 401 between the adjacent lenses and substantially orthogonal to the lens axis. The first channel 801 may have an upper channel surface 803 and a lower channel surface. The lower channel surface may face the upper channel surface 803. The lower channel surface may include a radial surface of the second structure 402 which may include a radial coated portion 805 of adjoining electrodes and an uncoated radial portion 807 abutting the radial coated portion 805. Between the adjoining electrodes is a support surface 808 being a surface of the support which faces the upper channel surface 803. The upper channel surface 803 may extend through the channel between the lenses such that the first surfaces 404 for each of the adjacent lenses have a common potential applied in operation. However, the electrode arrangements 407 on the second structures 402 of each of the adjacent lenses may be electrically isolated from each other.

Similarly, for said adjacent lenses in a lens array, the second gap of each lens may be comprised by a second channel 802 that extends within the first structure 401 between the adjacent lenses. The second channel 802 extends within the first structure 401 between the adjacent lenses and substantially orthogonal to the lens axis. The second channel 802 may have an upper channel surface and a lower channel surface 804. The lower channel surface 804 may extend through the channel between the lenses such that the second surfaces 405 for each of the adjacent lenses have a common potential applied in operation.

In all other aspects to the above-described differences, the lens design of FIG. 8 may be substantially the same as the lens design consistent with FIG. 4.

Although not shown in FIG. 8, the lens array may also include protrusions in the first structure 401 between adjacent lenses so that the first and second channels are not linear and/or have their channel width decreased by the protrusions. The protrusions may be substantially as described later with reference to FIG. 11, and shown therein by reference signs 1111 and 1113.

An advantage of a lens array comprising lenses consistent with FIG. 8 is that the pitch between adjacent lenses in a lens array may be less than that of a lens array comprising lenses consistent with the embodiments of FIG. 4. The lens array may therefore be denser.

The dimensions of the lens designs may be substantially as provided for FIG. 7. However, due to the lens design consistent with FIG. 8, the pitch, p, may be reduced to:

$p=a+2b+c=$about 190 μm to 200 μm.

FIG. 9 shows a lens design, according to some embodiments. The lens design according consistent with FIG. 9 differs from the lens design consistent with FIG. 4 in that the corresponding structure to the support 403 of the second structure 402 is not an insulator.

In FIG. 9, the corresponding structure to the support 403 is a support portion 905. The corresponding structure to the second structure 402 is an electrode portion 903. The first structure 401, support portion 905 and the electrode portion 903 may all be integral with each other, so as to provide an integrated structure. All of the first structure 401, support portion 905 and the electrode portion 903 may substantially comprise substrate. The electrode portion 903 also comprises one or more layers of electrical insulator 901 and one or more electrode arrangements 407.

The lens design consistent with FIG. 9 is similar to those of the designs consistent with FIGS. 4 and 8 in that the overall structure may be that of an Einzel lens.

The electrode portion 903 comprises end surfaces that extend in a direction that is orthogonal to the longitudinal axis. The end surface 911 partly defines the first gap with a facing surface 919 of the first structure 401. The electrode arrangement 407 is provided on a radially inward surface 909 of the electrode portion 903. The electrode portion 903 has a radially outward facing surface 913.

The support portion 905 is radially outward from the electrode portion 903 and has a facing surface 915 that faces the facing surface 919 of the first structure 401. The facing surface 915 of the support portion 905 is further from the facing surface 919 first structure 401 than the end surface 911.

Radially outward of the support portion 905 is a connection portion 907 which, within the integrated structure, connects the support portion 905 to the first structure 401. The connection portion 907 has a radially inward facing surface 917 that faces the radially outward surface 913 of the electrode portion 903. The part of the connection portion 907 abutting the first structure may be referred to as a stem.

The electrode portion 903 comprises a layer of electrical insulator 901 on one or more of its surfaces. The electrode arrangement 407 of the electrode portion 903 is provided on the layer of electrical insulator 901. The electrode arrangement 407 of the electrode portion 903 is thereby electrically insulated from the part of the electrode portion 903 that is integral with the support portion 905, which may be at a ground potential.

The layer of electrical insulator 901 may be provided on the radially inward surface 909 of the electrode portion 903. The layer of electrical insulator 901 may additionally be provided on the end surfaces 911 of the electrode portion 903 in a direction orthogonal to the longitudinal axis of the opening. The layer of electrical insulator 901 may additionally be provided on the radially outward surfaces 913 of the electrode portion 903.

As described earlier with reference to FIG. 4, the lens may be considered as comprising a first lens part and a second lens part. The first and second lens parts of the lens are respectively defined as being above and below the plane comprising the feedline as shown in FIG. 9. Accordingly, the first lens part is on one side of a plane that is orthogonal to the longitudinal axis of the opening and is substantially at the longitudinal position of the feedline. The first lens part may not include the feedline, may include at least part of the feedline or may include all of the feedline. The second lens part of the lens is on the other side of the plane to the first lens part. The second lens part may not include the feedline, may include at least part of the feedline or may include all of the feedline.

The layer of electrical insulator 901 may also extend, in a direction orthogonal to the longitudinal axis of the opening, into the lens along a lower surface of, or in, the first lens part such that the layer of electrical insulator 901 is above the feedline. The layer of electrical insulator 901 may also extend, in a direction orthogonal to the longitudinal axis of the opening, into the lens along an upper surface of, or in, the second lens part such that the layer of electrical insulator 901 is below the feedline. As shown in FIG. 9, each of the upper and lower surfaces of the feedline may thereby be electrically isolated from the other parts of the lens by a layer of electrical insulator 901.

The first and second lens parts have corresponding arrangements. Accordingly, the lens may be substantially symmetric about the plane that comprises the feedline.

In all other aspects to the above-described differences, the lens design consistent with FIG. 9 may be substantially the same as the lens design consistent with FIG. 4.

One of the effects of the structural differences between the lens designs of FIG. 4 and FIG. 9 is that the insulator is shielded from the electron beams travelling through the opening in different ways. In embodiments consistent with FIG. 9, the exposed surface of electrical insulator 901 is longitudinally extending instead of horizontally extending. The exposed surface of the electrical insulator 901 is on the opposite side of the electrode portion 903 to the radially inward surface 909. There is therefore no line-of-sight path between charged particles travelling through the opening and the exposed surface of the electrical insulator 901.

The geometry of the parts of the lens structure that defines the creep length is also different. The facing surface 915 of the support portion 905 may be at a ground potential. The creep length would comprise the entire length of the exposed surface of electrical insulator 901 along the radially outward surface 913 of the electrode portion 903.

Figure 10:
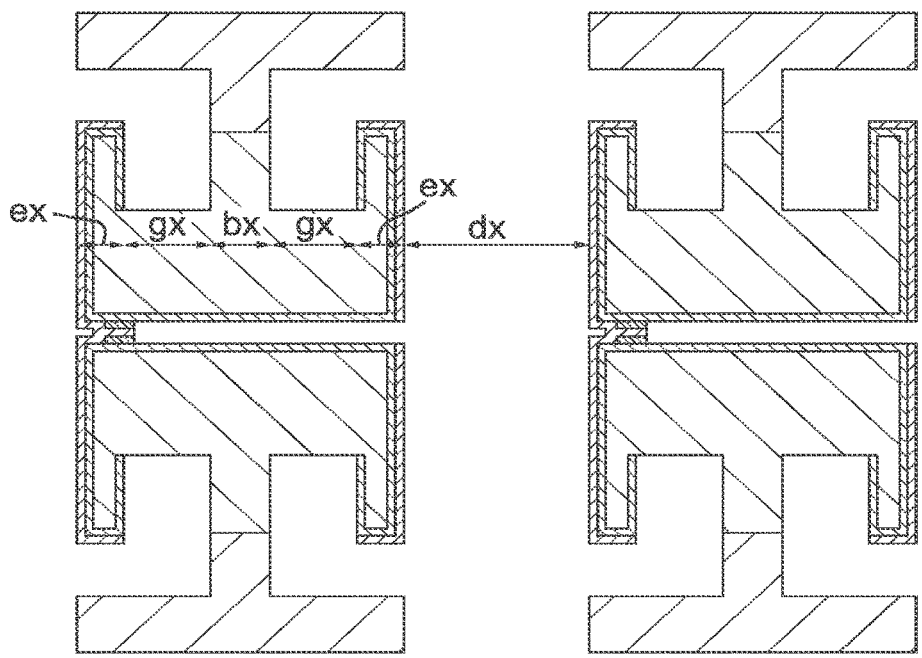
FIG. 10 shows a cross-section through a lens array that comprises lenses, according to some embodiments of the present disclosure.

FIG. 10 shows a cross-section through a lens array that comprises lenses according to embodiments consistent with FIG. 9. FIG. 10 shows two lenses of the lens array, with each lens being a lens consistent with FIG. 9. The cross-section is in a plane that includes the paths of charged particles through the lenses. The lens design allows the pitch, i.e., spacing, between the adjacent lenses to be relatively small and therefore a dense lens array to be provided.

The opening of each lens in the array is entirely surrounded by part of the first structure 401 such that each lens in the array is separated from all adjacent lenses in the array by the part of the first structure 401 that the lens's opening is formed in. Advantageously, this may substantially reduce, even prevent, potential cross-talk occurring between adjacent sub-beams.

In FIG. 10: shows various dimensions of elements of the lens array in a plane orthogonal to the central axis. Dimension 'bx' is the width of the connection portion 907. Dimension bx may be about 10 µm. Dimension 'dx' is the diameter of the lens between opposing radially inward facing surfaces 909; it may be about 140 µm. Dimension 'ex' is radial with of the electrode portion 903; it may be about 5 µm. Dimension 'gx' is the radial width of the support portion 905; it may be about 30 µm. The pitch, px, between adjacent lenses in the array is dependent on the dimensional elements: dx, ex, gx and bx. In an example, the minimal pitch between adjacent lenses is in the range:

$$px=dx+2ex+2gx+bx=\text{about 220 µm}.$$

Figure 11:
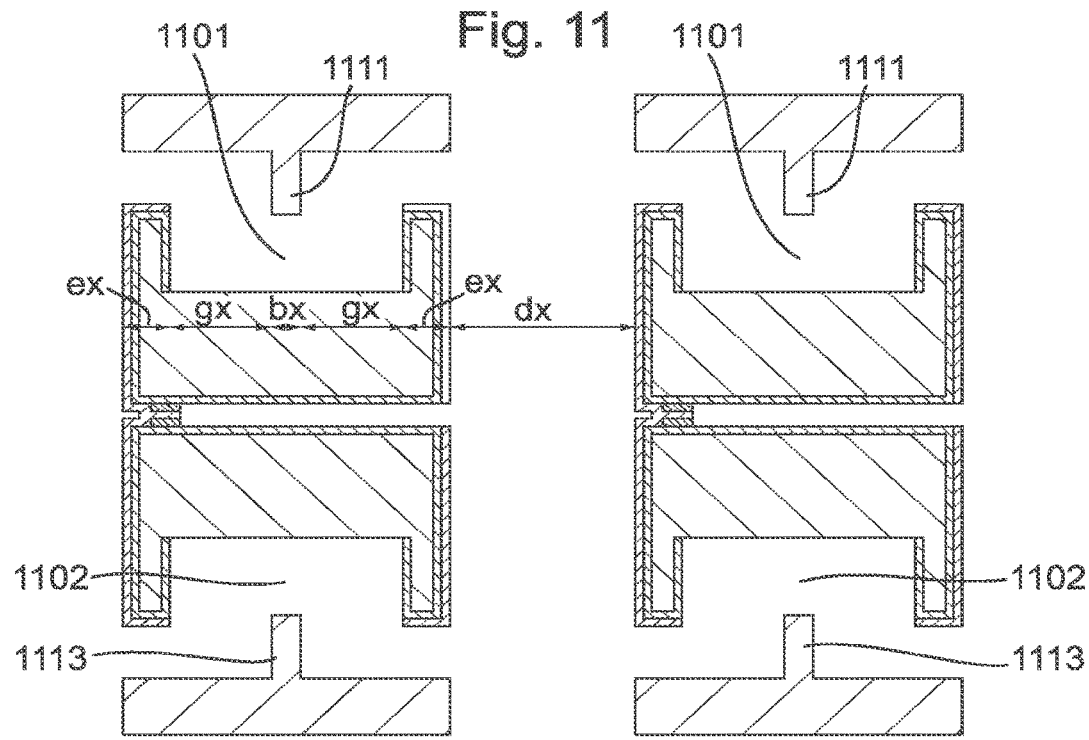
FIG. 11 shows a cross-section through a lens array that comprises lenses, according to some embodiments of the present disclosure.

FIG. 11 shows another lens array that comprises lenses according to some embodiments. The design of a lens consistent with FIG. 11 differs from the design of a lens consistent with FIG. 9 in that, when the lenses consistent with FIG. 11 are formed in a lens array, the opening of each lens is not entirely surrounded by part of the first structure 401, i.e. the connection portion 907. In embodiments consistent with FIG. 11, there are channels 1101, 1102 provided between adjacent lenses in a similar manner to as described earlier regarding FIG. 8. Accordingly, for adjacent lenses in a lens array, the first gap of each lens is comprised by a first channel 1101 that extends within the first structure 401 between the adjacent lenses. Similarly, for said adjacent lenses in a lens array, the second gap of each lens is comprised by a second channel 1102 that extends within the first structure 401 between the adjacent lenses.

In all other aspects to the above-described differences, the lens design consistent with FIG. 11 may be substantially the same as the lens design consistent with FIG. 9.

As shown in FIG. 11, between each adjacent pair of lenses, the first structure 401 may comprise a first set of protrusions 1111 with each protrusion 1111 extending, in a direction parallel to the longitudinal axis of the opening, such that the protrusion 1111 blocks a linear path of the first channel 1101 between the first gaps of adjacent lenses. Each protrusion 1111 may be associated with a channel 1101 between adjacent lenses. The stem of each protrusion may have the same features as part of the stem of the connection portion 907. However, unlike for the connection portion 907, for each protrusion the radially inwardly facing surface 917 ends at a junction with an end surface that is orthogonal to the longitudinal axis of the opening. Thus the radially inwardly facing surface 917 is dimensioned so that extends from the first portion and occludes a straight line path between the first gaps of adjacent lenses. A part of the radially inwardly facing surface 917 may face a portion of the radially outward surface 913 of the electrode portion 903.

Similarly, between each adjacent pair of lenses, the first structure 401 comprises a second set of protrusions 1113 that extend, in a direction parallel to the longitudinal axis of the opening, between adjacent lenses such that each protrusion in the second set of protrusions may block a linear path of the second channel 1102 between the second gaps of adjacent lenses. Similar features associated with the first set of protrusions 1111 apply to the second set of protrusions 1113.

The protrusions in the first and second sets of protrusions 1111, 1113 may respectively be at the same potential as the first surface 404 and the second surface 405. The protrusions may therefore be grounded.

In an alternative implementation, there are no protrusions in the first and second channels. The first and second channels may be substantially linear, such as the channels shown in FIG. 8.

An advantage of a lens array comprising lenses consistent with FIG. 11 is that the pitch between adjacent lenses in a lens array may be less than that of a lens array comprising lenses consistent with FIG. 9. The lens array may therefore be denser.

The dimensions of the lens designs may be substantially as provided for FIG. 10. However, due to the lens design consistent with FIG. 11, the dimension 'bx' may be reduced to 10 µm. The pitch, px, may therefore therefore reduced to:

$$px=dx+2ex+2gx+bx=\text{about 215 µm}.$$

The lens design consistent with FIG. 11 has a number of advantageous properties.

All of the embodiments of lens provide one or more of a number of different advantages. In particular, the exposed surfaces of each lens, i.e., the surfaces of the lens that the charged particles in the opening may potentially contact, are rotationally uniform/symmetric around the longitudinal axis. Charged particles travelling through the opening of the lens are therefore not inherently manipulated in an asymmetric way due to an asymmetric lens design.

The structure of each lens design substantially shields the exposed surfaces of insulator from electron beams travelling through the opening.

The feedline 408 of each lens is covered by at least part of the second structure 402 and support 403 and therefore does not directly affect the charged particles and does not break the symmetry of the exposed surfaces of the lens.

The lens designs according to embodiments may have a long creep length. This may be achieved by the creep length orientated at least partly parallel to, or with a component extending in the direction of, the beam path This may allow the use of a relatively large potential difference between adjacent electrodes. Orientating creep length at least partly in the direction of the beam path may allow the reduction of some of the dimensions of lens design and thereby a reduction of the pitch between adjacent lenses.

Each lens may be manufactured by separately manufacturing two parts of the lens and then bonding the two parts together.

The lens designs are also compact and suitable for use in a dense array of lenses, i.e., a dense lens array. The lens arrays according to embodiments may be used focus all of the sub-beams of a multi-beam.

Embodiments include a number of modifications and variations to the above-described embodiments.

Although embodiments have been described as providing lens designs, the lenses may generally be referred to as manipulators because they can be used to manipulate beams, or sub-beams, of charged particles. A possible application of a lens, or lens array, according to embodiments is the focusing of a beam, or sub-beams, of charged particles. The charged particles may be electrons. Alternative applications according to embodiments include de-focusing, accelerating or decelerating a beam, or sub-beams, of charged particles.

Embodiments have been described with reference to charged particles. The charged particles may be electrons or other types of charged particle, such as protons.

Tools comprising a lens, or lens array, according to embodiments may be used in a number of different applications that include electron microscopy in general, not just SEM, and lithography.

For example, embodiments include a multi-beam inspection and/or metrology tool that comprises a lens array according to embodiments.

The lenses according to embodiments can be made using a number of techniques that would be known to a skilled person in the art of semiconductor manufacturing processes. In particular, the manufacturing process may include one or more of the following processes that would be known to the skilled person: oxidation, lithography, etching, trench filling, planarization, Me (e.g., gold) deposition, Me sputter and bonding.

Each lens according to embodiments may comprise four or more sets of substrates. The sets of substrates may be separately manufactured and then bonded together to form the lens. For example, the first lens part of a lens as shown in FIG. 5 may comprise a first set of one or more substrates that provides the electrode arrangement 407, the second structure 402, the support 403 and the substrate on the other side of the support 403 than the second structure 402. The first lens part may also comprise a second set of one or more substrates that provide the first structure and the first surface 404. The second lens part of the lens may substantially be a mirror image of the first lens part about a plane comprising the feedline. The second lens part therefore also comprises two sets of substrates. The lens therefore comprises four sets of substrates that are bonded together to form the lens. In another arrangement, there are three sets of substrates. A first set of at least two substrates form the electrode arrangements 407, supports 403 and substrate elements 409 on either side of an enclosed feedline 408. A second set of at least one substrate provides the structure for the entrance electrode 404. A third set of at least one substrate provides the structure for the exit electrode 405. The second and third sets may be assembled with the first set after the first set is assembled. Alternatively the second and third sets may be joined with substrates of the first set before the first set is assembled.

Each lens according to embodiments may be comprised by a stack of substrates. The stack may comprise other elements than each lens on the same charged particle path as the lens. For example, the stack may comprise one or more deflector elements that are up-beam and/or down-beam of the lens in the charged particle path. Spacers may be provided on either the up-beam and/or down-beam sides of each lens. Each spacer may separate the lens from another element on the same charged particle path as the lens. Each spacer may be bonded to a completely manufactured lens. Alternatively, spacers may be bonded to each of the first and second lens parts of a lens before the first and second lens parts of the lens are bonded together. The entrance and exit electrodes 404, 405 may be considered to be spacer elements.

The features of first set of substrates of the first lens part of the lens shown in FIG. 5 may be manufactured in a number of different ways. For example, two trenches may be made in a substrate at the locations of the supports 403 on either side of the opening for the charged particles. The trenches may be filled with oxide. A third trench may then be formed, between the two filled trenches, that provides the opening for the charged particles and also forms the second structures 402 that are on the opening side of each of the filled trenches. A process may then be performed to reduce the longitudinal length of the oxide in the trenches, so that the oxide corresponds to the support 403 as shown in FIG. 5. The electrically conductive layers may then be formed on surfaces, as shown in FIG. 5.

The lens according to embodiments preferably comprises rotationally symmetric electrodes, preferably circular rotationally symmetric electrodes. If the electrodes are not rotationally symmetric then this may increase the extent of aberrations in a charged particle beam through the lens. Although the supporting structures of the electrodes may be rotationally symmetric, this is not essential. If the supporting structures of the electrodes are not rotationally symmetric, there may be no substantial increase in aberrations if the supporting structures are shielded by the electrodes from the beam of charged particles. In an arrangement the support is cylindrical such that it has circular rotational symmetry with respect to a beamlet path. In arrangement the support the rotationally symmetric support is a plurality of, preferably equidistantly spaced, longitudinal elements around the periphery of the focusing electrode 407; there may two, three, four or more equidistantly spaced longitudinal support elements.

In an arrangement, the electrode elements of FIGS. 4, 5, 7 and 8 may be electrically conductive doped silicon. Instead of being coated, the first and second structures 401, 402 may comprise doped substrate.

Embodiments include a number of modifications and variations to the techniques described above.

Throughout embodiments a longitudinal axis of an opening is described. This axis may be the same as a charged particle optical axis that describes the path of charged particles through, and output from, an illumination apparatus and/or a projection apparatus. The sub-beams of a multi-beam may all be substantially parallel to the charged particle optical axis. The charged particle optical axis may be the same as, or different from, a mechanical axis of the illumination apparatus and/or the projection apparatus.

Embodiments also include a beam path of charged particles through a lens, or each of a plurality of lenses in an array, according to embodiments being angled relative to the longitudinal axis of each opening. That is to say, the beam path through each lens is not along, or parallel to, the longitudinal axis of the lens. For example, a plurality of lenses in an array of lenses may each be arranged to manipulate a respective sub-beam in a multi-beam, the sub-beams within the multi-beam being divergent, or convergent, with respect to each other.

The techniques according to embodiments may be used to construct an Einzel lens. However, embodiments also include the construction of other types of manipulators, such as a manipulator with only two electrodes. For example, embodiments include an entire manipulator being the structure shown in FIG. 5 additionally comprising only the electrode arrangement 407, second structure 402, support 403 and substrate body 409 of a second lens part. That is to say, the second lens part may omit the substrate element 410 that provides the exit electrode. In such an arrangement, the lens arrangement may comprise three substrates: one for the substrate element 410 of the first lens part; and one for each of the second structures 402 of each for the first and second lens parts.

Embodiments include a multi-array Einzel lens configured in use to focus a plurality of beamlets of charged particles along a multi-beam path, wherein each Einzel lens in the array comprises a focusing electrode that is intermediate up-beam and down-beam electrodes along the beam path and is configured to be at a potential different from the up-beam and down-beam electrodes. The focusing electrode is electrically isolated from both the up-beam and down-beam electrodes. The focusing electrode may comprise a pole surface and a support. The support may be substantially symmetric around the beam path, configured to support, in a plane orthogonal to the beam path, the pole surface, and configured to electrically connect the pole surface.

Embodiments include a multi-array Einzel lens configured in use to focus a plurality of beamlets of charged particles along a multi-beam path, wherein each Einzel lens in the array comprises a focusing electrode that is intermediate to an up-beam and down-beam electrodes and configured to be isolated from, and at a potential different from, the up-beam and down-beam electrodes. The focusing electrode may extend along and substantially symmetrically around the beam path. Each Einzel lens may comprise a support configured to support the focusing electrode. The focusing electrode may extend further along the beam path than the support so that a dimensional difference between the support and along the beam path the focusing electrode provides a creep length parallel to the beam path.

Embodiments include a multi-array lens configured in use to focus a plurality of beamlets of charged particles along a multi-beam path, wherein each lens in the array comprises an entrance electrode, a focusing electrode down beam of the entrance electrode along a beamlet path and configured to be at a potential different during operation from the entrance electrode, and a support to support and electrically isolate the focusing electrode. The focusing electrode may be substantially rotationally symmetric around the beamlet path. Each lens in the array may further comprise an exit electrode. The focusing electrode may be up beam of the exit electrode along a beamlet path and configured to be at a potential different during operation from the exit electrode.

Embodiments include a multi-array lens configured in use to focus a plurality of beamlets of charged particles along a multi-beam path, wherein each lens in the array comprises: an entrance electrode, a focusing electrode down beam of the entrance electrode along a beamlet path and configured to be at a potential different from the entrance electrode. The focusing electrode may comprise a pole surface and a support. The support may be symmetric around the beamlet path, configured to support, in a plane orthogonal to the beam path, the pole surface, configured to electrically isolate the focusing electrode from the entrance electrode and configured to connect the pole surface to a feedline. Each lens in the array may further comprise an exit electrode. The focusing electrode may be up beam of the exit electrode along a beamlet path and configured to be at a potential different during operation from the exit electrode.

Embodiments include a multi-array Einzel lens configured in use to focus a plurality of beamlets of charged particles along a multi-beam path, wherein each Einzel lens in the array comprises a focusing electrode intermediate to an up-beam and down-beam electrode and configured to be isolated from, and at a potential different from, the up-beam and down-beam electrodes. The focusing electrode may extend along, and substantially symmetrically around, the beam path. Each lens may comprise a support configured to support the focusing electrode. The focusing electrode may extend further along the beamlet path than the support so that a dimensional difference between the support and along the beam path the focusing electrode provides a shield of the support to the beam path. The shielding may be provided by the radial position of the focusing electrode relative to the support.

The following is a summary of various example embodiments of the present disclosure.

According to some embodiments of the present disclosure, there is provided a manipulator lensing device for focusing a beam of charged particles, wherein the manipulator lensing device comprises: a first structure through which is formed an opening wherein the path of a beam of charged particles through the manipulator lensing device is substantially along a longitudinal axis of the opening; a second structure with a surface wherein, in a plane orthogonal to the longitudinal axis and along a first portion of the longitudinal axis, the surface surrounds the opening; a support that, in a plane orthogonal to the longitudinal axis and along at least part of the first portion of the longitudinal axis, connects the second structure to the first structure and surrounds the second structure so that the connection between the second structure and the first structure is symmetric around the longitudinal axis; and an electrode arrangement provided on the surface of the second structure such that the electrode arrangement surrounds the longitudinal axis of the opening and, in a plane that is orthogonal to the longitudinal axis, the surface of the second structure surrounds the electrode arrangement; wherein: a first surface of the first structure is arranged such that, in a plane orthogonal to the longitudinal axis and along at least a second portion of the longitudinal axis of the opening, the first surface surrounds the opening; a second surface of the first structure is arranged such that, in a plane orthogonal to the longitudinal axis and along at least a third portion of the longitudinal axis, the second surface surrounds the opening; the surface of the second structure is arranged along the longitudinal axis between the first and second surfaces of the first structure; the electrode arrangement and the first surface of the first structure are separated from each other in a direction parallel to the longitudinal axis so that there is a first gap between the electrode arrangement and the first surface of the first structure; and the electrode arrangement and the second surface of the first structure are separated from each other in a direction parallel to the longitudinal axis so that there is a second gap between the electrode arrangement and the second surface of the first structure.

Preferably: the surface of the second structure entirely surrounds the opening; the support entirely surrounds the second structure; the first surface of the first structure entirely surrounds the opening; the second surface of the first structure entirely surrounds the opening; and/or the electrode arrangement entirely surrounds the opening.

Preferably, the electrode arrangement is a single electrode.

Preferably, in a plane that is orthogonal to the longitudinal axis, the opening is circular.

Preferably, in a plane that is orthogonal to the longitudinal axis, the radius of the opening is larger at the first and second gaps that at the first and second portions of the longitudinal axis.

Preferably, in a plane that is orthogonal to the longitudinal axis, the electrode arrangement is annular.

Preferably, in a plane that is orthogonal to the longitudinal axis, the second structure is annular.

Preferably, in a plane that is orthogonal to the longitudinal axis, the support is annular.

Preferably, along the longitudinal axis, the extent of the support is less than the extent of the surface of the second structure.

Preferably, the longitudinal mid-point of the support is in the same plane as the longitudinal mid-point of the surface of the second structure.

Preferably, the manipulator lensing device further comprises a feedline, wherein the feedline electrically connects to the electrode arrangement.

Preferably, the feedline passes through the support and into the second structure.

Preferably, the feedline electrically connects to the electrode arrangement at the longitudinal mid-point of the electrode arrangement.

Preferably, in a plane orthogonal to the longitudinal axis, the electrode arrangement is surrounded by the feedline.

Preferably, the first electrode arrangement extends, in at least one plane orthogonal to the longitudinal axis, over at least one end of second structure.

Preferably, the manipulator lensing device is symmetric around the longitudinal axis.

Preferably, the charged particles are electrons.

Preferably: the manipulator lensing device comprises a first part and a second part; and the first part of the manipulator lensing device is bonded to the second part of the manipulator lensing device.

Preferably, a plane substantially at the longitudinal position of the feedline, and orthogonal to the longitudinal axis, provides the boundary between the first part and the second part.

Preferably, the second part of the manipulator lensing device is a substantial mirror of the first part of the manipulator lensing device.

Preferably: the first part of the manipulator lensing device comprises a first part of the first structure; the second part of the manipulator lensing device comprises a second part of the first structure; the first part of the first structure is a single layer of substrate; and the second part of the first structure is a single layer of substrate.

Preferably, the first surface of the first structure and the second surface of the first structure are at the same potential; and optionally, the potential is a ground potential.

Preferably, the support is an electrical insulator, such as a dielectric.

Preferably, the second structure is only connected to said electrical insulator.

Preferably: the second structure comprises substrate; and the electrode arrangement is on the surface of the substrate.

Preferably, the second structure is configured such that, in use, the electrical insulator is shielded from the beam of charged particles.

Preferably: the support comprises substrate; the second structure comprises substrate; the second structure comprises a layer of electrical insulator, such as dielectric, on the substrate; and the electrode arrangement is provided on the layer of electrical insulator.

According to some embodiments of the present disclosure, there is provided a manipulator lensing array that comprises a plurality of manipulator lensing devices according to the first aspect; wherein the openings of all of the manipulator lensing devices are comprised by the same first structure.

Preferably, the longitudinal axes of all of the openings of the manipulator lensing devices are substantially parallel with each other.

Preferably, each manipulator device in the manipulator array is configured to focus a different sub-beam of a multi-beam.

Preferably, the opening of each manipulator lensing device is entirely surrounded by part of the first structure such that each manipulator lensing device is separated from all adjacent manipulator lensing devices by the part of the first structure that the opening is formed in.

Preferably, for adjacent manipulator lensing devices: the first gap of each manipulator lensing device is comprised by a first channel that extends within the first structure between the manipulator lensing devices; between each adjacent pair of manipulator lensing devices, the first structure comprises a first set of protrusions that extend, parallel to the longitudinal axis, such that a protrusion in the first set of protrusions blocks a linear path of the first channel between the first gaps of adjacent manipulator lensing devices; the second gap of each manipulator lensing device is comprised by a second channel that extends within the substantially planar structure between the manipulator lensing devices; and between each adjacent pair of manipulator lensing devices, the first structure comprises a second set of protrusions that extend, parallel to the longitudinal direction, between adjacent manipulator lensing devices such that a protrusion in the second set of protrusions structure blocks a linear path of the second channel between the second gaps of adjacent manipulator lensing devices.

Preferably, at least some of the protrusions in the first and/or second set of protrusions are ground connections.

According to some embodiments of the present disclosure, there is provided a method of bonding the first part of the manipulator lensing device to the second part of the manipulator lensing device.

According to some embodiments of the present disclosure, there is provided an Einzel lens for focusing a beam of charged particles, wherein the Einzel lens comprises: a focusing electrode arrangement to which a voltage for focusing a beam of charged particles is applied; a first electrode arrangement on a main body of the Einzel lens; and a second electrode arrangement on a main body of the Einzel lens, wherein, along the longitudinal axis of the Einzel lens, the focusing electrode arrangement is arranged between the first and second ground electrode arrangements and the focusing electrode arrangement is electrically isolated from both the first and second ground electrode arrangements; wherein the focusing electrode arrangement comprises: a structure on which one or more electrodes are formed; and a support that, in a plane orthogonal to the longitudinal axis, mechanically connects the structure to the main body of the Einzel lens with a connection that is symmetric around the longitudinal axis.

Preferably, the Einzel lens further comprise a feedline that passes, in a plane orthogonal to the longitudinal axis, through the support, into the structure and electrically connects to the one or more electrodes of the focusing arrangement.

Preferably, the first electrode arrangement and the second electrode arrangement are at the same potential; and optionally, the potential is a ground potential.

Preferably, the Einzel lens comprises: a first electrode configured to be set at a first potential; a focusing electrode configured to be at a second potential; and a second electrode configured to be substantially at the first potential; the electrodes being arranged along the beam path such that the focusing electrode is between the first and second electrodes; wherein: the focusing electrode is electrically isolated from both the first and second electrodes, the focusing electrode comprising: a pole surface; and a support that is symmetrical around the beam path and is configured to support, a plane orthogonal to the beam path, the pole surface and to electrically connect the pole surface.

Preferably, the support comprises a feedline that is configured to pass through the support and electrically connect to the pole surface.

Preferably, the feedline passes through the support in a plane orthogonal to the longitudinal axis.

According to some embodiments of the present disclosure, there is provided an Einzel lens configured in use to focus a beam of charged particles in a beam path, wherein the Einzel lens comprises: a first electrode configured to be set at a first potential; a focusing electrode configured to be at a second potential, the focusing electrode extending along and symmetrically around the beam path; a second electrode configured to be substantially at the first potential; and a support configured to support the focusing electrode, wherein the focusing electrode is configured to be electrically isolated from the first and second electrodes and the focusing electrode extends further along the beam path than the support so that a dimensional difference between the support and the focusing electrode along the beam path provides a creep length parallel to the beam path.

According to some embodiments of the present disclosure, there is provided an Einzel lens configured in use to focus a beam of charged particles in a beam path, wherein the Einzel lens comprises: a first electrode configured to be set at a first potential; a focusing electrode configured to be at a second potential, wherein the focusing electrode extends along and symmetrically around the beam path and the focusing electrode comprises a pole surface on a structure; a second electrode configured to be substantially at the first potential; and a support configured to support the focusing electrode, the electrodes being arranged along the beam path such that the focusing electrode is between the first and second electrodes, wherein the focusing electrode is configured to be electrically isolated from the first and second electrodes.

Preferably, the support is an electrical insulator.

Preferably, the structure is only connected to said electrical insulator.

Preferably: the structure comprises substrate; and the one or more electrodes are on the surface of the substrate.

Preferably, the structure is configured such that, in use, the electrical insulator is shielded from the beam of charged particles focused by the Einzel lens.

Preferably: the support comprises substrate; the structure comprises substrate; the structure comprises a layer of electrical insulator on the substrate; and the one or more electrodes are provided on the layer of electrical insulator.

Preferably: the longitudinal extent of the structure along the longitudinal axis of the Einzel lens is longer than the longitudinal extent of the support; and the structure and support are arranged such that increasing the longitudinal extent of the structure relative to the longitudinal extent of the support increases the creep length of the focusing electrode arrangement.

According to some embodiments of the present disclosure, there is provided a multi-array Einzel lens configured in use to focus a plurality of beamlets of charged particles along a multi-beam path, wherein each Einzel lens in the array comprises: a focusing electrode that is intermediate up-beam and down-beam electrodes along the beam path and is configured to be at a potential different from the up-beam and down-beam electrodes, wherein the focusing electrode is electrically isolated from both the up-beam and down-beam electrodes; wherein the focusing electrode comprises: a pole surface; and a support; wherein the support is: substantially symmetric around the beam path; configured to support, in a plane orthogonal to the beam path, the pole surface; and configured to electrically connect the pole surface.

According to some embodiments of the present disclosure, there is provided a multi-array Einzel lens configured in use to focus a plurality of beamlets of charged particles along a multi-beam path, wherein each Einzel lens in the array comprises: a focusing electrode that is intermediate to an up-beam and down-beam electrodes and configured to be isolated from, and at a potential different from, the up-beam and down-beam electrodes, the focusing electrode extending along and substantially symmetric around the beam path; and a support configured to support the focusing electrode; wherein the focusing electrode extends further along the beam path than the support so that a dimensional difference between the support and along the beam path the focusing electrode provides a creep length parallel to the beam path.

According to some embodiments of the present disclosure, there is provided a multi-array lens configured in use to focus a plurality of beamlets of charged particles along a multi-beam path, wherein each lens in the array comprises: an entrance electrode; a focusing electrode down beam of the entrance electrode along a beamlet path and configured to be at a potential different during operation from the entrance electrode; and a support to support and electrically isolate the focusing electrode, wherein the focusing electrode is substantially rotationally symmetric around the beamlet path.

Preferably, each lens in the array further comprises: an exit electrode; wherein the focusing electrode is up beam of the exit electrode along a beamlet path and configured to be at a potential different during operation from the exit electrode.

According to some embodiments of the present disclosure, there is provided a multi-array lens configured in use to focus a plurality of beamlets of charged particles along a multi-beam path, wherein each lens in the array comprises: an entrance electrode; a focusing electrode down beam of the entrance electrode along a beamlet path and configured to be at a potential different from the entrance electrode, wherein the focusing electrode comprises: a pole surface; and a support; wherein the support is: symmetric around the beamlet path; configured to support, in a plane orthogonal to the beam path, the pole surface; configured electrically to isolate the focusing electrode from the entrance electrode; and configured electrically to connect the pole surface.

Preferably, each lens in the array further comprises: an exit electrode; wherein the focusing electrode is up beam of the exit electrode along a beamlet path and configured to be at a potential different during operation from the exit electrode.

According to some embodiments of the present disclosure, there is provided a multi-array Einzel lens configured in use to focus a plurality of beamlets of charged particles along a multi-beam path, wherein each Einzel lens in the array comprises: a focusing electrode intermediate to an up-beam and down-beam electrode and configured to be isolated from, and at a potential different from, the up-beam and down-beam electrodes, wherein the focusing electrode extends along and substantially symmetrically around the beam path; and a support configured to support the focusing electrode; wherein the focusing electrode extends further along the beamlet path than the support so that a dimensional difference between the support and along the beam path the focusing electrode provides a shield of the support to the beam path.

Preferably, the shielding is provided by the radial position of the focusing electrode relative to the support.

According to some embodiments of the present disclosure, there is provided a multi-array lens configured in use to focus a plurality of beamlets of charged particles along a multi-beam path, wherein each lens in the array comprises: an entrance electrode; a focusing electrode down beam of the entrance electrode along a beamlet path and configured to be at a potential different from the entrance electrode; and a support configured to support the focusing electrode relative to the entrance electrode, wherein the focusing electrode and support are configured so that in operation the lens generates a rotationally symmetrical field around the beamlet path.

While the embodiments of the present disclosure have been described in connection with various example, other embodiments will be apparent to those skilled in the art from consideration of the specification and practice of the technology disclosed herein. It is intended that the specification and examples be considered as exemplary only, with a true scope and spirit being indicated by the following claims.

The descriptions above are intended to be illustrative, not limiting. Thus, it will be apparent to one skilled in the art that modifications may be made as described without departing from the scope of the claims set out below.

The various embodiments may be summarized by the following clauses:

Clause 1: A manipulator lensing device for focusing a beam of charged particles, wherein the manipulator lensing device comprises:
- a first structure through which is formed an opening wherein the path of a beam of charged particles through the manipulator lensing device is substantially along a longitudinal axis of the opening;
- a second structure with a surface wherein, in a plane orthogonal to the longitudinal axis and along a first portion of the longitudinal axis, the surface surrounds the opening;
- a support that, in a plane orthogonal to the longitudinal axis and along at least part of the first portion of the longitudinal axis, connects the second structure to the first structure and surrounds the second structure so that the connection between the second structure and the first structure is symmetric around the longitudinal axis; and
- an electrode arrangement provided on the surface of the second structure such that the electrode arrangement surrounds the longitudinal axis of the opening and, in a plane that is orthogonal to the longitudinal axis, the surface of the second structure surrounds the electrode arrangement;

wherein:
- a first surface of the first structure is arranged such that, in a plane orthogonal to the longitudinal axis and along at least a second portion of the longitudinal axis of the opening, the first surface surrounds the opening;
- a second surface of the first structure is arranged such that, in a plane orthogonal to the longitudinal axis and along at least a third portion of the longitudinal axis, the second surface surrounds the opening;
- the surface of the second structure is arranged along the longitudinal axis between the first and second surfaces of the first structure;
- the electrode arrangement and the first surface of the first structure are separated from each other in a direction parallel to the longitudinal axis so that there is a first gap between the electrode arrangement and the first surface of the first structure; and
- the electrode arrangement and the second surface of the first structure are separated from each other in a direction parallel to the longitudinal axis so that there is a second gap between the electrode arrangement and the second surface of the first structure.

Clause 2: The manipulator lensing device according to clause 1, wherein: the surface of the second structure entirely surrounds the opening; the support entirely surrounds the second structure; the first surface of the first structure entirely surrounds the opening; the second surface of the first structure entirely surrounds the opening; and/or the electrode arrangement entirely surrounds the opening.

Clause 3: The manipulator lensing device according to clause 1 or 2, wherein the electrode arrangement is a single electrode.

Clause 4: The manipulator lensing device according to any preceding clause, wherein in a plane that is orthogonal to the longitudinal axis, the opening is circular.

Clause 5: The manipulator lensing device according to clause 4, wherein, in a plane that is orthogonal to the longitudinal axis, the radius of the opening is larger at the first and second gaps that at the first and second portions of the longitudinal axis.

Clause 6: The manipulator lensing device according to any preceding clause, wherein, in a plane that is orthogonal to the longitudinal axis, the electrode arrangement is annular.

Clause 7: The manipulator lensing device according to any preceding clause, wherein, in a plane that is orthogonal to the longitudinal axis, the second structure is annular.

Clause 8: The manipulator lensing device according to any preceding clause, wherein, in a plane that is orthogonal to the longitudinal axis, the support is annular.

Clause 9: The manipulator lensing device according to any preceding clause, wherein, along the longitudinal axis, the extent of the support is less than the extent of the surface of the second structure.

Clause 10: The manipulator lensing device according to any preceding clause, wherein, the longitudinal mid-point of the support is in the same plane as the longitudinal mid-point of the surface of the second structure.

Clause 11: The manipulator lensing device according to any preceding clause, the manipulator lensing device further comprising a feedline, wherein the feedline electrically connects to the electrode arrangement.

Clause 12: The manipulator lensing device according to clause 11, wherein, the feedline passes through the support and into the second structure.

Clause 13: The manipulator lensing device according to clause 11 or 12, wherein, the feedline electrically connects to the electrode arrangement at the longitudinal mid-point of the electrode arrangement.

Clause 14: The manipulator lensing device according to any of clauses 11 to 13, wherein, in a plane orthogonal to the longitudinal axis, the electrode arrangement is surrounded by the feedline.

Clause 15: The manipulator lensing device according to any preceding clause, wherein the first electrode arrangement extends, in at least one plane orthogonal to the longitudinal axis, over at least one end of second structure.

Clause 16: The manipulator lensing device according to any preceding clause, wherein the manipulator lensing device is symmetric around the longitudinal axis.

Clause 17: The manipulator lensing device according to any preceding clause, wherein the charged particles are electrons.

Clause 18: The manipulator lensing device according to any preceding clause, wherein: the manipulator lensing device comprises a first part and a second part; and the first part of the manipulator lensing device is bonded to the second part of the manipulator lensing device.

Clause 19: The manipulator lensing device according to clause 18, when clause 18 is dependent on any of clauses 11 to 17, wherein, a plane substantially at the longitudinal position of the feedline, and orthogonal to the longitudinal axis, provides the boundary between the first part and the second part.

Clause 20: The manipulator lensing device according to clause 19, wherein, the second part of the manipulator lensing device is a substantial mirror of the first part of the manipulator lensing device.

Clause 21: The manipulator lensing device according to any of clauses 18 to 20, wherein: the first part of the manipulator lensing device comprises a first part of the first structure; the second part of the manipulator lensing device comprises a second part of the first structure; the first part of the first structure is a single layer of substrate; and the second part of the first structure is a single layer of substrate.

Clause 22: The manipulator lensing device according to any preceding clause, wherein the first surface of the first structure and the second surface of the first structure are at the same potential; and optionally, the potential is a ground potential.

Clause 23: The manipulator lensing device according to any preceding clause, wherein the support is an electrical insulator, such as a dielectric.

Clause 24: The manipulator lensing device according to clause 23, wherein the second structure is only connected to said electrical insulator.

Clause 25: The manipulator lensing device according to clause 24, wherein: the second structure comprises substrate; and the electrode arrangement is on the surface of the substrate Clause 26: The manipulator lensing device according to any of clauses 23 to 25, wherein the second structure is configured such that, in use, the electrical insulator is shielded from the beam of charged particles.

Clause 27: The manipulator lensing device according to any of clauses 1 to 22, wherein: the support comprises substrate; the second structure comprises substrate; the second structure comprises a layer of electrical insulator, such as dielectric, on the substrate; and the electrode arrangement is provided on the layer of electrical insulator.

Clause 28: A manipulator lensing array that comprises a plurality of manipulator lensing devices according to any preceding clause; wherein the openings of all of the manipulator lensing devices are comprised by the same first structure.

Clause 29: The manipulator lensing array according to clause 28, wherein the longitudinal axes of all of the openings of the manipulator lensing devices are substantially parallel with each other.

Clause 30: The manipulator lensing array according to clause 28 or 29, wherein each manipulator device in the manipulator array is configured to focus a different sub-beam of a multi-beam.

Clause 31: The manipulator lensing array according to any of clauses 28 to 30, wherein the opening of each manipulator lensing device is entirely surrounded by part of the first structure such that each manipulator lensing device is separated from all adjacent manipulator lensing devices by the part of the first structure that the opening is formed in.

Clause 32: The manipulator lensing array according to any of clauses 28 to 30, wherein, for adjacent manipulator lensing devices: the first gap of each manipulator lensing device is comprised by a first channel that extends within the first structure between the manipulator lensing devices; between each adjacent pair of manipulator lensing devices, the first structure comprises a first set of protrusions that extend, parallel to the longitudinal direction, such that a protrusion in the first set of protrusions blocks a linear path of the first channel between the first gaps of adjacent manipulator lensing devices; the second gap of each manipulator lensing device is comprised by a second channel that extends within the substantially planar structure between the manipulator lensing devices; and between each adjacent pair of manipulator lensing devices, the first structure comprises a second set of protrusions that extend, parallel to the longitudinal direction, between adjacent manipulator lensing devices such that a protrusion in the second set of protrusions structure blocks a linear path of the second channel between the second gaps of adjacent manipulator lensing devices.

Clause 33: The manipulator lensing array according to clause 32, wherein at least some of the protrusions in the first and/or second set of protrusions are ground connections.

Clause 34: A method of manufacturing a manipulator lensing device according to clause 18, or any clause dependent thereon, the method comprising: bonding the first part of the manipulator lensing device to the second part of the manipulator lensing device.

Clause 35: An Einzel lens for focusing a beam of charged particles, wherein the Einzel lens comprises: a focusing electrode arrangement to which a voltage for focusing a beam of charged particles is applied; a first electrode arrangement on a main body of the Einzel lens; and a second electrode arrangement on a main body of the Einzel lens, wherein, along the longitudinal axis of the Einzel lens, the focusing electrode arrangement is arranged between the first and second ground electrode arrangements and the focusing electrode arrangement is electrically isolated from both the first and second ground electrode arrangements; wherein the focusing electrode arrangement comprises: a structure on which one or more electrodes are formed; and a support that, in a plane orthogonal to the longitudinal axis, mechanically connects the structure to the main body of the Einzel lens with a connection that is symmetric around the longitudinal axis.

Clause 36: The Einzel lens according to clause 35, further comprising a feedline that passes, in a plane orthogonal to the longitudinal axis, through the support, into the structure and electrically connects to the one or more electrodes of the focusing arrangement.

Clause 37: The Einzel lens according to clause 35 or 36, wherein the first electrode arrangement and the second electrode arrangement are at the same potential; and optionally, the potential is a ground potential.

Clause 38: An Einzel lens configured in use to focus a beam of charged particles in a beam path, wherein the Einzel lens comprises: a first electrode configured to be set at a first potential; a focusing electrode configured to be at a second potential; and a second electrode configured to be substantially at the first potential; the electrodes being arranged along the beam path such that the focusing electrode is between the first and second electrodes; wherein: the focusing electrode is electrically isolated from both the first and second electrodes, the focusing electrode comprising: a pole surface; and a support that is symmetrical around the beam path and is configured to support, a plane orthogonal to the beam path, the pole surface and to electrically connect the pole surface.

Clause 39: The Einzel lens according to clause 38, wherein the support comprises a feedline that is configured to pass through the support and electrically connect to the pole surface.

Clause 40: The Einzel lens according to clause 38, wherein the feedline passes through the support in a plane orthogonal to the longitudinal axis.

Clause 41: An Einzel lens configured in use to focus a beam of charged particles in a beam path, wherein the Einzel lens comprises: a first electrode configured to be set at a first potential; a focusing electrode configured to be at a second potential, the focusing electrode extending along and symmetrically around the beam path; a second electrode configured to be substantially at the first potential; and a support configured to support the focusing electrode, wherein the focusing electrode is configured to be electrically isolated from the first and second electrodes and the focusing electrode extends further along the beam path than the support so that a dimensional difference between the support and the focusing electrode along the beam path provides a creep length parallel to the beam path.

Clause 42: An Einzel lens configured in use to focus a beam of charged particles in a beam path, wherein the Einzel lens comprises: a first electrode configured to be set at a first potential; a focusing electrode configured to be at a second potential, wherein the focusing electrode extends along and symmetrically around the beam path and the focusing electrode comprises a pole surface on a structure; a second electrode configured to be substantially at the first potential; and a support configured to support the focusing electrode, the electrodes being arranged along the beam path such that the focusing electrode is between the first and second electrodes, wherein the focusing electrode is configured to be electrically isolated from the first and second electrodes Clause 43: The Einzel lens according to clause 42, wherein the support is an electrical insulator.

Clause 44: The Einzel lens according to clause 43, wherein the structure is only connected to said electrical insulator.

Clause 45: The Einzel lens according to any of clause 42 to 44, wherein: the structure comprises substrate; and the one or more electrodes are on the surface of the substrate Clause 46: The Einzel lens according to any of clauses 42 to 45, wherein the structure is configured such that, in use, the electrical insulator is shielded from the beam of charged particles focused by the Einzel lens.

Clause 47: The Einzel lens according to clause 42, wherein: the support comprises substrate; the structure comprises substrate; the structure comprises a layer of electrical insulator on the substrate; and the one or more electrodes are provided on the layer of electrical insulator.

Clause 48: The Einzel lens according to any of clauses 42 to 47, wherein: the longitudinal extent of the structure along the longitudinal axis of the Einzel lens is longer than the longitudinal extent of the support; and the structure and support are arranged such that increasing the longitudinal extent of the structure relative to the longitudinal extent of the support increases the creep length of the focusing electrode arrangement.

Clause 49: A multi-array Einzel lens configured in use to focus a plurality of beamlets of charged particles along a multi-beam path, wherein each Einzel lens in the array comprises: a focusing electrode that is intermediate up-beam and down-beam electrodes along the beam path and is configured to be at a potential different from the up-beam and down-beam electrodes, wherein the focusing electrode is electrically isolated from both the up-beam and down-beam electrodes; wherein the focusing electrode comprises: a pole surface; and a support; wherein the support is: substantially symmetric around the beam path; configured to support, in a plane orthogonal to the beam path, the pole surface; and configured to electrically connect the pole surface.

Clause 50: A multi-array Einzel lens configured in use to focus a plurality of beamlets of charged particles along a multi-beam path, wherein each Einzel lens in the array comprises: a focusing electrode that is intermediate to an up-beam and down-beam electrodes and configured to be isolated from, and at a potential different from, the up-beam and down-beam electrodes, the focusing electrode extending along and substantially symmetric around the beam path; and a support configured to support the focusing electrode; wherein the focusing electrode extends further along the beam path than the support so that a dimensional difference between the support and along the beam path the focusing electrode provides a creep length parallel to the beam path.

Clause 51: A multi-array lens configured in use to focus a plurality of beamlets of charged particles along a multi-beam path, wherein each lens in the array comprises: an entrance electrode; a focusing electrode down beam of the entrance electrode along a beamlet path and configured to be at a potential different during operation from the entrance electrode; and a support to support and electrically isolate the focusing electrode, wherein the focusing electrode is substantially rotationally symmetric around the beamlet path.

Clause 52: The multi-array lens according to clause 51, wherein each lens in the array further comprises: an exit electrode; wherein the focusing electrode is up beam of the exit electrode along a beamlet path and configured to be at a potential different during operation from the exit electrode.

Clause 53: A multi-array lens (also referred to as a lens array) configured in use to focus a plurality of beamlets of charged particles along a multi-beam path, wherein each lens in the array comprises: an entrance electrode; a focusing electrode down beam of the entrance electrode along a beamlet path and configured to be at a potential different from the entrance electrode, wherein the focusing electrode comprises: a pole surface; and a support; wherein the support is: symmetric around the beamlet path; configured to support, in a plane orthogonal to the beam path, the pole surface; configured electrically to isolate the focusing electrode from the entrance electrode; and configured electrically to connect the pole surface.

Clause 54: The lens array of clause 53 wherein the pole surface extends further along the beamlet path the support.

Clause 55: The lens array of clause 53 or 54, wherein the pole piece is configured to shield the beamlet path and the support from each other, preferably provided by the radial position of the focusing electrode relative to the support Clause 56: The lens array of any of clauses 53 to 55, wherein the focusing electrode is electrically connected through the support; and preferably electrically isolated from the entrance electrode.

Clause 57: The lens array of any of clauses 53 to 56, wherein each lens of the array further comprises a feedline configured to connect electrically the focusing electrode, the feedline preferably extending through the support preferably in a direction orthogonal to the beamlet path.

Clause 58: The lens array of any of clauses 53 to 57, wherein the feedline connects to the focusing electrode at a longitudinal mid-point of the focusing electrode.

Clause 59: The lens array of any of clauses 53 to 58, wherein the support is cylindrical such that it has circular rotational symmetry with respect to a beamlet path.

Clause 60: The lens array any of clauses 53 to 59, wherein the rotationally symmetric support is a plurality of, longitudinal elements around the periphery of the focusing electrode.

Clause 61: The lens array of any of clauses 53 to 60, wherein the plurality of longitudinal elements are equidistantly spaced around the periphery of the focusing electrode.

Clause 62: The lens array of any clauses 53 to 61, wherein the support comprises an insulator, preferably a dielectric.

Clause 63: The lens array according to any of clauses 53 to 62, wherein each lens in the array further comprises: an exit electrode;

Clause 64: The lens array according to clauses 63, wherein the focusing electrode is up beam of the exit electrode along a beamlet path and configured to be at a potential different during operation from the exit electrode.

Clause 65: The lens array of clause 63 or 64, wherein the entrance and exit electrodes have mirror symmetry with respect to each other in a plane orthogonal to the beamlet path, Clause 66: The lens array of any of clauses 53 to 65, wherein the lens array comprises substrate and preferably at least two adjoining substrates.

Clause 67: The lens array of any of clauses 53 to 66, wherein the lenses of the lens array are Einzel lenses.

Clause 68: A multi-array Einzel lens configured in use to focus a plurality of beamlets of charged particles along a multi-beam path, wherein each Einzel lens in the array comprises: a focusing electrode intermediate to an up-beam and down-beam electrode and configured to be isolated from, and at a potential different from, the up-beam and down-beam electrodes, wherein the focusing electrode extends along and substantially symmetrically around the beam path; and a support configured to support the focusing electrode; wherein the focusing electrode extends further along the beamlet path than the support so that a dimensional difference between the support and along the beam path the focusing electrode provides a shield of the support to the beam path.

Clause 69: The multi-array Einzel lens according to clause 68, wherein the shielding is provided by the radial position of the focusing electrode relative to the support.

Clause 70: An multi-array lens configured in use to focus a plurality of beamlets of charged particles along a multi-beam path, wherein each lens in the array comprises: an entrance electrode; a focusing electrode down beam of the entrance electrode along a beamlet path and configured to be at a potential different from the entrance electrode; and a support configured to support the focusing electrode relative to the entrance electrode, wherein the focusing electrode and support are configured so that in operation the lens generates a rotationally symmetrical field around the beamlet path.

Clause 71: A multi-array lens array configured in use to focus a plurality of beamlets of charged particles along a multi-beam path, wherein each lens in the array comprises a manipulator lensing device of any of clauses 1 to 27, or the Einzel lens of clauses 35 to 48.

Clause 72: A electron-optical system configured to project a plurality of beamlets of charged particles along a multi-beam path, wherein the projection optical-system comprises a multi-array Einzel lens of any of clauses 49 to 50, 68 or 69, a manipulator lensing array of any of clauses 28 to 33, and/or an multi-array lens array of any of clauses 51 to 67, 70 or 71.

Clause 73: A multi-beam inspection and/or metrology tool comprising an electron-optical system of clause 72.

The invention claimed is:

1. A manipulator lensing device for focusing a beam of charged particles, wherein the manipulator lensing device comprises:

a first structure through which is formed an opening wherein a path of a beam of charged particles through the manipulator lensing device is substantially along a longitudinal axis of the opening;

a second structure with a surface wherein, in a plane orthogonal to the longitudinal axis and along a first portion of the longitudinal axis, the surface surrounds the opening;

a support that, in a plane orthogonal to the longitudinal axis and along at least part of the first portion of the longitudinal axis, connects the second structure to the first structure and surrounds the second structure so that the connection between the second structure and the first structure is symmetric around the longitudinal axis; and an electrode arrangement provided on the surface of the second structure such that the electrode arrangement surrounds the longitudinal axis of the opening and, in a plane that is orthogonal to the longitudinal axis, the surface of the second structure surrounds the electrode arrangement; a first surface of the first structure being arranged such that, in a plane orthogonal to the longitudinal axis and along at least a second portion of the longitudinal axis of the opening, the first surface surrounds the opening;

a second surface of the first structure being arranged such that, in a plane orthogonal to the longitudinal axis and along at least a third portion of the longitudinal axis, the second surface surrounds the opening;

the surface of the second structure being arranged along the longitudinal axis between the first and second surfaces of the first structure the electrode arrangement and the first surface of the first structure being separated from each other in a direction parallel to the longitudinal axis so that there is a first gap between the electrode arrangement and the first surface of the first structure; and the electrode arrangement and the second surface of the first structure being separated from each other in a direction parallel to the longitudinal axis so that there is a second gap between the electrode arrangement and the second surface of the first structure, wherein, along the longitudinal axis, an extent of the support is less than an extent of the surface of the second structure and/or electrode arrangement.

2. The manipulator lensing device according to claim 1, wherein:

the surface of the second structure entirely surrounds the opening;

the support entirely surrounds the second structure;

the first surface of the first structure entirely surrounds the opening;

the second surface of the first structure entirely surrounds the opening; and/or the electrode arrangement entirely surrounds the opening.

3. The manipulator lensing device according to claim 1, wherein the electrode arrangement is a single electrode.

4. The manipulator lensing device according to claim 1, wherein in a plane that is orthogonal to the longitudinal axis, the opening is circular.

5. The manipulator lensing device according to claim 1, wherein, in a plane that is orthogonal to the longitudinal axis, at least one of the electrode arrangement, the second structure and the support are annular.

6. The manipulator lensing device according to claim 1, the manipulator lensing device further comprising a feedline, wherein the feedline electrically connects to the electrode arrangement.

7. The manipulator lensing device according to claim 6, wherein,
the feedline passes through the support and into the second structure;
the feedline electrically connects to the electrode arrangement at a longitudinal mid-point of the electrode arrangement; and/or
in a plane orthogonal to the longitudinal axis, the electrode arrangement is surrounded by the feedline.

8. The manipulator lensing device according to claim 1, wherein the electrode arrangement extends, in at least one plane orthogonal to the longitudinal axis, over at least one end of second structure.

9. The manipulator lensing device according to claim 1, wherein the manipulator lensing device is symmetric around the longitudinal axis.

10. The manipulator lensing device according to claim 1, wherein the first surface of the first structure and the second surface of the first structure are at the same potential; and optionally, the potential is a ground potential.

11. The manipulator lensing device according to claim 1, wherein the support is an electrical insulator, such as a dielectric and, optionally, the second structure is only connected to said electrical insulator.

12. The manipulator lensing device according to claim 11, wherein the second structure is configured such that, in use, the electrical insulator is shielded from the beam of charged particles.

13. The manipulator lensing device according to claim 1, wherein:
the support comprises substrate;
the second structure comprises substrate;
the second structure comprises a layer of electrical insulator, such as dielectric, on the substrate; and
the electrode arrangement is provided on the layer of electrical insulator.

14. A multi-array lens array configured in use to focus a plurality of beamlets of charged particles along a multi-beam path, wherein each lens in the array comprises a manipulator lensing device of claim 1.

15. An electron-optical system configured to project a plurality of beamlets of charged particles along a multi-beam path, wherein the electron-optical system comprises a multi-array lens array of claim 14.

16. An Einzel lens configured in use to focus a beam of charged particles in a beam path, wherein the Einzel lens comprises:
a first electrode configured to be set at a first potential; a focusing electrode configured to be at a second potential, wherein the focusing electrode extends along and symmetrically around the beam path and the focusing electrode comprises a pole surface on a structure;
a second electrode configured to be substantially at the first potential; and
a support configured to support the focusing electrode, the electrodes being arranged along the beam path such that the focusing electrode is between the first and second electrodes, wherein the focusing electrode is configured to be electrically isolated from the first and second electrodes, wherein:
a longitudinal extent of the structure along the longitudinal axis of the Einzel lens is longer than a longitudinal extent of the support; and
the structure and support are arranged such that increasing the longitudinal extent of the structure relative to the longitudinal extent of the support increases a creep length of the focusing electrode.

17. The Einzel lens according to claim 16, wherein the support is an electrical insulator.

18. The Einzel lens according to claim 16, wherein: the structure comprises substrate; and the one or more electrodes are on the surface of the substrate.

19. The Einzel lens according to claim 17, wherein the structure is configured such that, in use, the electrical insulator is shielded from the beam of charged particles focused by the Einzel lens.

20. The Einzel lens according to claim 16, wherein: the support comprises substrate; the structure comprises substrate; the structure comprises a layer of electrical insulator on the substrate; and the one or more electrodes are provided on the layer of electrical insulator.

* * * * *